US012807789B2

(12) United States Patent
Gaide et al.

(10) Patent No.: US 12,807,789 B2
(45) Date of Patent: Nov. 24, 2026

(54) PRECURSOR COMPOSITIONS INCLUDING A CURABLE COMPONENT AND SURFACE COATED OR MODIFIED HOLLOW GLASS MICROSPHERES, ARTICLES, ADDITIVE MANUFACTURING METHODS, AND METHODS OF INTERFERING WITH ELECTROMAGNETIC RADIATION

(71) Applicant: 3M INNOVATIVE PROPERTIES COMPANY, St. Paul, MN (US)

(72) Inventors: Tom Gaide, Cologne (DE); Jens Eichler, Kaarst (DE); Christian Weinmann, Alsdorf (DE); Friedrich M. Wolff, Burghausen (DE); Stefan V. Friedrich, Kastl (DE); Karoline Anna Ostrowski, Duesseldorf (DE); Adrian S. Eckert, Herrsching (DE); Michael H. Stalder, Uedem (DE); Philipp Jurgen Semmler, Ahrensburg (DE); Badri Veeraraghavan, Woodbury, MN (US); Klaus Hintzer, Kastl (DE); Jennifer J. Sokol, Mahtomedi, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 165 days.

(21) Appl. No.: 18/550,489

(22) PCT Filed: Mar. 31, 2022

(86) PCT No.: PCT/IB2022/053031

§ 371 (c)(1),
(2) Date: Sep. 14, 2023

(87) PCT Pub. No.: WO2022/234357

PCT Pub. Date: Nov. 10, 2022

(65) Prior Publication Data

US 2024/0150551 A1 May 9, 2024

Related U.S. Application Data

(60) Provisional application No. 63/184,841, filed on May 6, 2021.

(51) Int. Cl.

| | |
|---|---|
| ***C08K 9/04*** | (2006.01) |
| ***B29C 64/124*** | (2017.01) |
| ***B29K 509/08*** | (2006.01) |
| ***C08K 9/02*** | (2006.01) |
| ***H05K 9/00*** | (2006.01) |

(52) U.S. Cl.

CPC .............. *C08K 9/04* (2013.01); *B29C 64/124* (2017.08); *C08K 9/02* (2013.01); *H05K 9/0083* (2013.01);

(Continued)

(58) Field of Classification Search

CPC ...... C08K 9/04; C08K 9/02; C08K 2201/003; C08K 9/06; C08K 7/28; B29C 64/124;

(Continued)

(56) References Cited

U.S. PATENT DOCUMENTS

| | | | | |
|---|---|---|---|---|
| 4,612,242 | A | 9/1986 | Vesley et al. | |
| 5,051,334 | A * | 9/1991 | Fan | G03F 7/0037 430/947 |
| 5,929,130 | A | 7/1999 | Suzuki et al. | |
| 7,514,477 | B2 | 4/2009 | Klare et al. | |
| 7,727,931 | B2 | 6/2010 | Brey et al. | |
| 8,698,394 | B2 | 4/2014 | Mccutcheon et al. | |
| 9,205,601 | B2 | 12/2015 | Desimone et al. | |
| 9,360,757 | B2 | 6/2016 | Desimone et al. | |
| 10,624,820 | B2 | 4/2020 | Bonderer et al. | |
| 2007/0267784 | A1 | 11/2007 | Greiner | |

(Continued)

FOREIGN PATENT DOCUMENTS

| | | | |
|---|---|---|---|
| CN | 102311233 | A | 1/2012 |
| CN | 107286609 | A | 10/2017 |
| CN | 107973528 | B | 10/2020 |
| DE | 102015219185 | B4 | 1/2023 |

(Continued)

OTHER PUBLICATIONS

International Search Report for PCT International Application No. PCT/IB2022/053031, mailed on Jun. 28, 2022, 4 pages.

(Continued)

*Primary Examiner* — Jessica M Roswell
(74) *Attorney, Agent, or Firm* — Adrian L. Pishko

(57) ABSTRACT

The present disclosure provides compositions, articles, and methods related to altering electromagnetic radiation. An actinic radiation curable precursor composition of a three-dimensional article includes a) a resin comprising an actinic radiation curable component, wherein the resin has a viscosity no greater than 500 cP; b) hollow glass microspheres having a density no greater than 2 g/mL and an average diameter no greater than 200 micrometers; and c) a photoinitiator. At least part of the surface of the hollow glass microspheres comprises a surface coating or modification. An article includes a photo(co)polymerization reaction product of the composition. A method of manufacturing a three-dimensional article includes the steps of a) providing an actinic radiation curable precursor composition; and b) selectively exposing a portion of the composition to a source of actinic radiation to at least partially cure the exposed portion of the composition, thereby forming a cured layer. Steps a) and b) are repeated so as to form a three-dimensional article. A three-dimensional article is provided, obtained according to the method. Methods of interfering with electromagnetic radiation originating from an electromagnetic radiation producing device are provided, including integrating an article into the electronic device or placing an article in the vicinity of the electromagnetic radiation producing device.

20 Claims, 8 Drawing Sheets

(52) U.S. Cl.
CPC ... *B29K 2509/08* (2013.01); *B29K 2995/0011* (2013.01); *B29K 2995/0063* (2013.01); *C08K 2201/003* (2013.01)

(58) Field of Classification Search
CPC .............. H05K 9/0083; B29K 2509/08; B29K 2995/001; B29K 2995/0063; B22F 1/18; B22F 10/12; B33Y 70/10; B33Y 80/00; H01Q 1/526
See application file for complete search history.

(56) References Cited

U.S. PATENT DOCUMENTS

| | | | | |
|---|---|---|---|---|
| 2009/0017256 | A1 * | 1/2009 | Hunt | C09D 4/06 428/335 |
| 2022/0033604 | A1 * | 2/2022 | Kohlstrung | C08J 9/0061 |

FOREIGN PATENT DOCUMENTS

| | | | |
|---|---|---|---|
| EP | 0670341 | B1 | 9/1999 |
| EP | 1434089 | A1 | 6/2004 |
| EP | 2502728 | A1 | 9/2012 |
| EP | 1776968 | B1 | 9/2013 |
| EP | 3147707 | B1 | 4/2019 |
| JP | 2010031279 | A | 2/2010 |
| JP | 2016164253 | A | 9/2016 |
| JP | 2017007921 | A | 1/2017 |
| JP | 2017165622 | A | 9/2017 |
| RU | 2703230 | C1 | 10/2019 |
| WO | 2007048819 | A1 | 5/2007 |
| WO | 2016083797 | A1 | 6/2016 |
| WO | 2016158468 | A1 | 10/2016 |
| WO | 2017014067 | A1 | 1/2017 |
| WO | 2017221599 | A1 | 12/2017 |
| WO | 2018065093 | A1 | 4/2018 |
| WO | 2018210602 | A1 | 11/2018 |
| WO | 2019108808 | A2 | 6/2019 |

OTHER PUBLICATIONS

Shah, "Highly filled resins for DLP-based printing of low density high modulus materials", Additive Manufacturing, Jan. 2021, vol. 37, 101736, 11pages.
Sigma-Aldrich_Bisphenol A ethoxylate diacrylate product specification_ 1 page.

* cited by examiner

PRECURSOR COMPOSITIONS INCLUDING A CURABLE COMPONENT AND SURFACE COATED OR MODIFIED HOLLOW GLASS MICROSPHERES, ARTICLES, ADDITIVE MANUFACTURING METHODS, AND METHODS OF INTERFERING WITH ELECTROMAGNETIC RADIATION

FIELD

The present disclosure relates to altering electromagnetic radiation emitted by devices.

SUMMARY

Precursor compositions, articles, and methods are provided related to altering electromagnetic radiation.

In a first aspect, an actinic radiation curable precursor composition of a three-dimensional article is provided. The actinic radiation curable precursor composition comprises a) a resin comprising an actinic radiation curable component, wherein the resin has a viscosity no greater than 500 centipoises (cP) when measured at 23°C; b) a plurality of hollow glass microspheres having a density no greater than 2 grams per milliliters (g/mL) and an average diameter no greater than 200 micrometers, wherein at least part of the surface of the hollow glass microspheres comprises a surface coating or modification; and c) a photoinitiator.

In a second aspect, an article is provided. The article comprises a photo(co)polymerization reaction product of the composition according to the first aspect.

In a third aspect, a method of manufacturing a three-dimensional article is provided. The method comprises the steps of: (a) providing an actinic radiation curable precursor composition according to the first aspect; and (b) selectively exposing a portion of the actinic radiation curable precursor composition to a source of actinic radiation to at least partially cure the exposed portion of the actinic radiation curable precursor composition, thereby forming a cured layer. Steps (a) and (b) are repeated so as to form a three-dimensional article.

In a fourth aspect, a three-dimensional article is provided. The three-dimensional article is obtained according to the method of the third aspect.

In a fifth aspect, a method of interfering with electromagnetic radiation originating from an electromagnetic radiation producing device and received by an electronic device is provided. The method comprises the step of integrating an article according to the second aspect or the fourth aspect into the electronic device or placing an article according to the second aspect or the fourth aspect in the vicinity of the electronic device.

In a sixth aspect, a method of interfering with electromagnetic radiation originating from an electromagnetic radiation producing device is provided. The method comprises the step of integrating an article according to the second aspect or the fourth aspect into the electronic device or placing an article according to the second aspect or the fourth aspect in the vicinity of the electromagnetic radiation producing device.

At least certain aspects of the present disclosure advantageously contribute to achieving optimized materials for electromagnetic radiation altering articles.

The above summary of the present disclosure is not intended to describe each disclosed embodiment or every implementation of the present invention. The description that follows more particularly exemplifies illustrative embodiments. In several places throughout the application, guidance is provided through lists of examples, which examples may be used in various combinations. In each instance, the recited list serves only as a representative group and should not be interpreted as an exclusive list. Thus, the scope of the present disclosure should not be limited to the specific illustrative structures described herein, but rather extends at least to the structures described by the language of the claims, and the equivalents of those structures. Any of the elements that are positively recited in this specification as alternatives may be explicitly included in the claims or excluded from the claims, in any combination as desired. Although various theories and possible mechanisms may have been discussed herein, in no event should such discussions serve to limit the claimable subject matter.

Figure 1A:
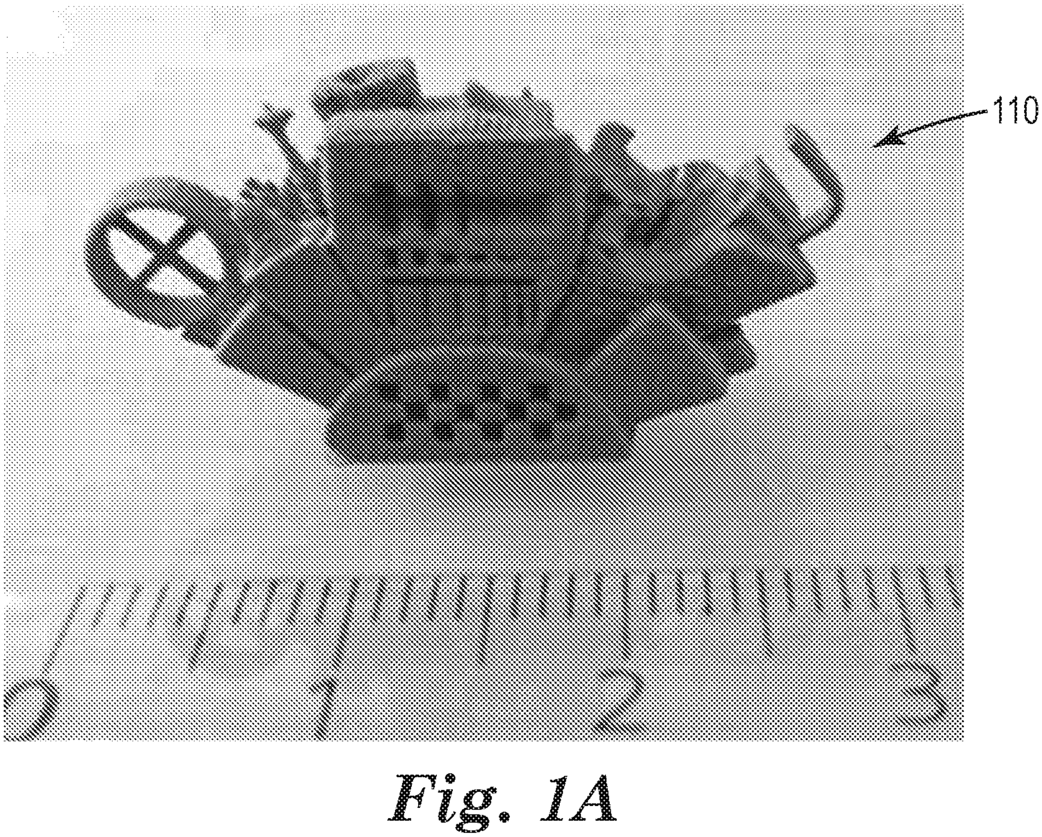
FIG. 1A is a photograph of an exemplary three-dimensional article preparable according to the present disclosure.

While the above-identified figures set forth several embodiments of the disclosure, other embodiments are also contemplated, as noted in the description. The figures are not necessarily drawn to scale. In all cases, this disclosure presents the invention by way of representation and not limitation.

DETAILED DESCRIPTION

Glossary

As used herein, "actinic radiation" encompasses UV radiation, e-beam radiation, visible radiation, infrared radiation, gamma radiation, and any combination thereof.

As used herein, "matrix" refers to a three-dimensionally continuous medium.

As used herein, a "monomer" is a single, one unit molecule capable of combination with itself or other monomers to form oligomers or polymers; an "oligomer" is a component having 2 to 9 repeat units; and a "polymer" is a component having 10 or more repeat units.

As used herein, "particle" refers to a substance being a solid having a shape which can be geometrically determined. The shape can be regular or irregular. Particles can be hollow, solid throughout, or porous. Particles can typically be analyzed with respect to, e.g., particle size and particle size distribution. A particle can comprise one or more crystallites. Thus, a particle can comprise one or more crystal phases. The term "primary particle size" refers to the size of a non-associated single nanoparticle, which is considered to be a primary particle. X-ray diffraction (XRD) is typically used to measure the primary particle size of crystalline materials; transmission electron microscopy (TEM) is typically used to measure the primary particle size of amorphous materials.

As used herein, "diameter" refers to the longest straight length across a shape (two-dimensional or three-dimensional) that intersects a center of the shape.

As used herein, "fluid" refers to emulsions, dispersions, suspensions, solutions, and pure components having a continuous liquid phase, and excludes powders and particulates in solid form.

As used herein, "curing" and "polymerizing" each mean the hardening or partial hardening of a composition by any mechanism, e.g., by heat, light, radiation, e-beam, microwave, chemical reaction, or combinations thereof.

As used herein, "cured" refers to a material or composition that has been hardened or partially hardened (e.g., polymerized or crosslinked) by one or more curing mechanisms.

As used herein, each of "photopolymerizable" and "photocurable" refers to a composition containing at least one material that can be hardened or partially hardened using actinic radiation.

As used herein, the term "ethylenically unsaturated" refers to a group that comprises at least one carbon-carbon double bond, including at least one of (1) a vinyl group ($CH_2{=}CH{-}$); (2) a (meth)acryloyloxy group ($CH_2{=}CR{-}(CO){-}O{-}$), wherein R is hydrogen or methyl); or (3) a (meth)acrylamido group ($CH_2{=}CR{-}(CO){-}NH{-}$), wherein R is hydrogen or methyl; or a maleic group ($-(CO){-}(CH{=}CH){-}(CO){-}$).

As used herein, the term "(meth)acrylate" is a shorthand reference to acrylate, methacrylate, or combinations thereof, "(meth)acrylic" is a shorthand reference to acrylic, methacrylic, or combinations thereof, and "(meth)acryl" is a shorthand reference to acryl and methacryl groups. "Acryl" refers to derivatives of acrylic acid, such as acrylates, methacrylates, acrylamides, and methacrylamides. By "(meth)acryl" is meant a monomer or oligomer having at least one acryl or methacryl group and linked by an aliphatic segment if containing two or more groups. As used herein, "(meth)acrylate-functional compounds" are compounds that include, among other things, a (meth)acrylate moiety.

Also herein, all numbers are assumed to be modified by the term "about" and preferably by the term "exactly." As used herein in connection with a measured quantity, the term "about" refers to that variation in the measured quantity as would be expected by the skilled artisan making the measurement and exercising a level of care commensurate with the objective of the measurement and the precision of the measuring equipment used. Also herein, the recitations of numerical ranges by endpoints include all numbers subsumed within that range as well as the endpoints (e.g., 1 to 5 includes 1, 1.5, 2, 2.75, 3, 3.80, 4, 5, etc.).

As used herein as a modifier to a property or attribute, the term "generally", unless otherwise specifically defined, means that the property or attribute would be readily recognizable by a person of ordinary skill but without requiring absolute precision or a perfect match (e.g., within +/−20% for quantifiable properties). The term "substantially", unless otherwise specifically defined, means to a high degree of approximation (e.g., within +/−10% for quantifiable properties) but again without requiring absolute precision or a perfect match. Terms such as same, equal, uniform, constant, strictly, and the like, are understood to be within the usual tolerances or measuring error applicable to the particular circumstance rather than requiring absolute precision or a perfect match.

Altering electromagnetic waves is of commercial importance in various ways. Often, an electronic device (e.g., a "victim") is protected from interfering electromagnetic waves from another device or apparatus (e.g., an "interferer") by any of reflection, attenuation, or redirection. With the ever-increasing density of electronic devices as well as digitalization of more and more technical fields, solutions for protection of devices gains increasing importance. One application area is the adaptation of distribution of electromagnetic waves from an antenna signal, such as altering a direction of the electromagnetic waves due to local limitations or increasing the efficiency of the antenna.

The present disclosure provides a combination of dielectric materials (e.g., dielectric particle filled polymers) having specific electromagnetic radiation wave altering designs with the use of additive manufacturing (e.g., also referred to as "3D-printing") design freedom. The dielectric materials can be classified in three general material classes (i.e., transparent, redirecting, or absorbing, electromagnetic waves). For instance, uncoated hollow glass microspheres are classified as transparent materials due to being low dielectric and low loss materials. Surface coated and/or modified hollow glass microspheres are classified as redirecting materials when the particular coating/modification makes them high dielectric and low loss materials. Alternatively, surface coated and/or modified hollow glass microspheres are classified as absorbing materials when the particular coating/modification makes them high loss materials. Additive manufacturing offers unique possibilities to offer solutions with respect to weight reduction or easier assembly due to new design options. In some cases, depending on a frequency range, certain dielectric filler particles are suitable, and can be processed in polymer matrix composite-based additive manufacturing or 3D-printing technologies (e.g., stereolithography (SLA), etc.). More particularly, the dielectric filler particles include hollow glass microspheres having a modification and/or coating on some or all of their exterior surfaces.

Electromagnetic wave altering designs have various forms, e.g., including different principles of lens designs, frequency selective surfaces, meta materials, and absorbers.

Electromagnetic lenses or electromagnetic redirectors can be used to generate an interference pattern to effectively bundle or redirect the electromagnetic energy to a focal point or a different direction. The necessary different phase delays can be realized through different runtimes (e.g., group delays) of the electromagnetic wave through the lens medium. This may be achieved by modifying either thickness or effective permittivity as a gradient along the material. The gradient may be continuous or stepped, depending on the required specifications. Additive manufacturing, for instance, can be used to generate nearly any kind of surface topology on the material to generate this gradient. The topology can also (or alternatively) be hidden inside the material block or realized by different densities of the material. In case of multi-material additive manufacturing, material gradients or composition changes can be used.

Frequency-selective-surfaces or -materials act like a filter for pre-defined wavelengths of electromagnetic waves. Some frequencies can pass through while others will get reflected. This can be achieved by adding structural features (e.g., holes, slots, inclusions, etc.) on or inside the material that have a magnitude of a wavelength. By generating these kinds of resonant features, particularly using additive manufacturing, a substantial freedom to generate complex frequency characteristics can be achieved. This may lead to solutions that can be tailored to specific needs. For instance, a cover for an antenna could be created, which is transparent in the frequency bandwidth of the used communication channel but reflects at other frequencies to shield the antenna from unwanted signals.

Absorbers transfer electromagnetic energy into heat. This phenomenon can be used, for example, to protect electronic circuits from radiation. A high lossy material may be printed via additive manufacturing to have a shape designed to perfectly fit onto the printed circuit board (pcb) of the protected or interfering circuit. This design freedom enables the absorber to be used also inside tight housings to support miniaturization.

Alternatively, the structure of an electromagnetic radiation altering article can be designed in a way that it creates an effective medium. The properties of the unstructured material can be altered using hollow, porous, or grid-like structures in cases where the radiation wavelength is much larger (e.g., more than 4 times larger) than the structural feature size. As an example, a direct comparison of dielectric properties can be determined for an unfilled base polymer once as a solid plate and once reducing total weight using a honeycomb design, for instance as described in the examples below. The effective medium principle may be used to generate a material with an even lower permittivity (e.g., closer to 1), leading to enhanced transparent materials. This design option also offers weight reduction potential.

Another variant of the effective medium principle includes metamaterials. "Metamaterials" is a collective term for materials with electromagnetic properties normally not found in nature. Usually, the real part of permeability and/or permittivity of a material is positive. With metamaterials, both properties are negative leading to a negative refractive index (i.e., double negative materials (DNG)). By designing small inclusions that are small compared to the wavelength of the surrounding medium but resonant for the bulk material, the real part of both permittivity and permeability can be designed to be negative for a certain small frequency band. Such a material can lead to useful designs for, e.g., antennas, lenses, miniaturization, etc.

Actinic Radiation Curable Precursor Composition of Three-Dimensional Articles

In a first aspect, an actinic radiation curable precursor composition of a three-dimensional article is provided. The composition comprises:

a) a resin comprising an actinic radiation curable component, wherein the resin has a viscosity no greater than 500 cP, when measured at 23°C;

b) a plurality of hollow glass microspheres having a density no greater than 2 g/mL and an average diameter no greater than 200 micrometers, wherein at least part of the surface of the hollow glass microspheres comprises a surface coating or modification; and c) a photoinitiator.

Figure 1B:
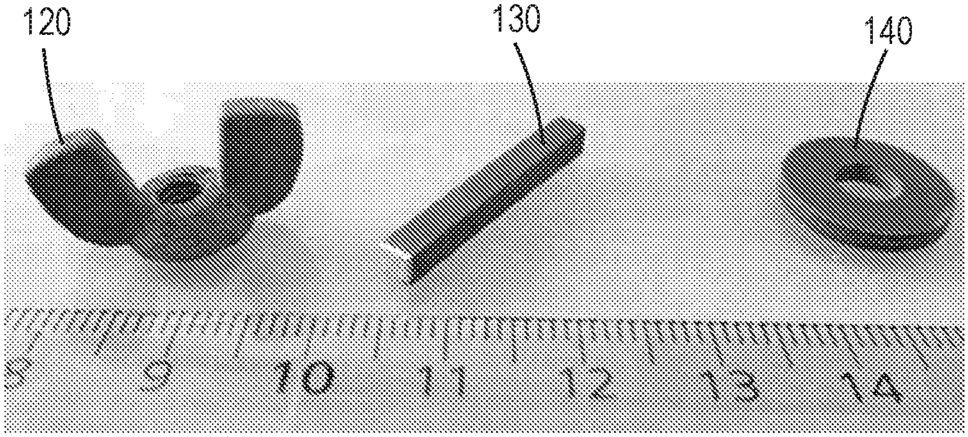
FIG. 1B is a photograph of three exemplary three-dimensional articles preparable according to the present disclosure.

Hollow glass microspheres can provide multiple advantageous properties to a polymeric article, such as light weighting, cost reduction, reinforcement, and/or insulation. It has been discovered that surface coated or surface modified hollow glass microspheres can additionally provide dielectric properties, for instance low dielectric constant and low loss characteristics, plus can be successfully formed into composite articles using certain additive manufacturing methods. For instance, actinic radiation curable compositions containing 20 volume percent (vol. %) or 30 vol. % aluminum-coated hollow glass microspheres have been successfully manufactured using stereolithography, including forming articles having some small features. Referring to FIG. 1A, a three-dimensional article 110 was formed from a precursor composition having an aluminum-coated hollow glass microsphere content of 20 vol. %. The ruler in the photograph indicates the scale of the article 110, which clearly has features less than an eighth of an inch in size. Referring to FIG. 1B, three different three-dimensional articles (120, 130, 140) are shown that were formed from a precursor composition having an aluminum-coated hollow glass microsphere content of 30 vol. %. The ruler in the photograph indicates the scale of each of the articles. FIG. 1B includes a wing nut 120 (i.e., comprising threads), a rectangular cuboid 130, and a washer 140.

The resin of the precursor composition the resin is suitable for use in radiation-induced additive manufacturing, for example stereolithography and digital light processing. Often, the actinic radiation curable component of the resin comprises a photo(co)polymerizable mixture comprising (or consisting of) at least one ethylenically unsaturated compound (e.g., polyfunctional ethylenically unsaturated compounds). Such ethylenically unsaturated compounds may be selected from the group consisting of monomers, dimers, trimers, oligomers, polymers, and any combinations or mixtures thereof. In some cases, the ethylenically unsaturated compounds are selected from the group consisting of mono(meth)acrylates, poly(meth)acrylates, and any combinations or mixtures thereof. For instance, the ethylenically unsaturated compounds are selected from the group consisting of poly(meth)acrylates, such as from the group consisting of di-, tri-, tetra- or penta-functional monomeric or oligomeric aliphatic, cycloaliphatic or aromatic (meth)acrylates, and any combinations or mixtures thereof. In certain cases, the actinic radiation curable component comprises the photo(co)polymerization reaction product of a photo(co)polymerizable mixture consisting of mono poly(meth)acrylates or poly(meth)acrylates, and any combinations or mixtures thereof.

Suitable monofunctional (meth)acrylate monomers include for instance and without limitation, dicyclopentadienyl acrylate, dicyclopentanyl acrylate, dimethyl-1-adamantyl acrylate, cyclohexyl methacrylate, tetrahydrofurfuryl methacrylate, 2-phenoxyethyl methacrylate, butyl methacrylate (e.g., tert-butyl methacrylate or isobutyl methacrylate), benzyl methacrylate, n-propylmethacrylate, 3,3,5-trimethylcyclohexyl methacrylate, butyl-cyclohexylmethacrylate (e.g., cis-4-tert-butyl-cyclohexylmethacrylate, 73/27 trans/cis-4-tert-butylcyclohexylmethacrylate, or trans-4-tert-butylcyclohexyl methacrylate), 2-decahydronapthyl methacrylate, 1-adamantyl acrylate, dicyclopentadienyl methacrylate, dicyclopentanyl methacrylate, isobornyl methacrylate (e.g., d,l-isobornyl methacrylate), dimethyl-1-adamantyl methacrylate, bornyl methacrylate (e.g., d,l-bornyl methacrylate), 3-tetracyclo[4.4.0.1.1]dodecyl methacrylate, 1-adamantyl methacrylate, isobornyl acrylate, tertiary butyl acrylate, or combinations thereof.

Exemplary monomers with two (meth)acryloyl groups include 1,2-ethanediol diacrylate, 1,3-propanediol diacrylate, 1,9-nonanediol diacrylate, 1,12-dodecanediol diacrylate, 1,4-butanediol diacrylate, 1,6-hexanediol diacrylate, butylene glycol diacrylate, bisphenol A diacrylate, diethylene glycol diacrylate, triethylene glycol diacrylate, tetraethylene glycol diacrylate, tripropylene glycol diacrylate, polyethylene glycol diacrylate, polypropylene glycol diacrylate, polyethylene/polypropylene copolymer diacrylate, polybutadiene di(meth)acrylate, propoxylated glycerin tri(meth) acrylate, and neopentylglycol hydroxypivalate diacrylate modified caprolactone.

Exemplary monomers with three or four (meth)acryloyl groups include, but are not limited to, trimethylolpropane triacrylate (e.g., commercially available under the trade designation TMPTA-N from Cytec Industries, Inc. (Smyrna, GA, USA) and under the trade designation SR-351 from Sartomer (Exton, PA, USA)), pentaerythritol triacrylate (e.g., commercially available under the trade designation SR-444 from Sartomer), ethoxylated (3) trimethylolpropane triacrylate (e.g., commercially available under the trade designation SR-454 from Sartomer), ethoxylated (4) pentaerythritol tetraacrylate (e.g., commercially available under the trade designation SR-494 from Sartomer), tris(2-hydroxyethylisocyanurate) triacrylate (e.g., commercially available under the trade designation SR-368 from Sartomer), a mixture of pentaerythritol triacrylate and pentaerythritol tetraacrylate (e.g., commercially available from Cytec Industries, Inc., under the trade designation PETIA with an approximately 1:1 ratio of tetraacrylate to triacrylate and under the trade designation PETA-K with an approximately 3:1 ratio of tetraacrylate to triacrylate), pentaerythritol tetraacrylate (e.g., commercially available under the trade designation SR-295 from Sartomer), and di-trimethylolpropane tetraacrylate (e.g., commercially available under the trade designation SR-355 from Sartomer).

Exemplary monomers with five or six (meth)acryloyl groups include, but are not limited to, dipentaerythritol pentaacrylate (e.g., commercially available under the trade designation SR-399 from Sartomer) and a hexa-functional urethane acrylate (e.g., commercially available under the trade designation CN975 from Sartomer).

Exemplary suitable ethylenically unsaturated oligomers and polymers include for instance and without limitation, hydroxypropyl methacrylate, triethyleneglucose dimethacrylate, and ethoxylated bisphenol A dimethacrylate.

In some embodiments, the resin is substantially free of cationic polymerizable components, for instance cationic polymerizable components selected from the group consisting of cyclic ether compounds, cyclic acetal compounds, cyclic thioether compounds, cyclic lactone compounds, divinyl ether compounds, and any combinations or mixtures thereof. Similarly, in some embodiments, the actinic radiation curable component comprises a photo(co)polymerizable mixture that is substantially free of cationic polymerizable components, for instance cationic polymerizable components selected from the group consisting of cyclic ether compounds, cyclic acetal compounds, cyclic thioether compounds, cyclic lactone compounds, divinyl ether compounds, and any combinations or mixtures thereof.

Advantageously, the resin itself (i.e., free of the hollow glass microspheres) that is included in the precursor composition has a low viscosity. For instance, in some embodiments, the unfilled resin has a dynamic viscosity no greater than 450 cP, no greater than 400 cP, no greater than 350 cP, no greater than 300 cP, no greater than 250 cP, no greater than 200 cP, no greater than 180 cP, no greater than 160 cP, no greater than 150 cP, no greater than 140 cP, no greater than 130 cP, no greater than 120 cP, no greater than 110 cP, or even no greater than 100 cP, when measured at 23°C, for instance as determined using a Brookfield viscometer. Conditions for the dynamic viscosity test include use of an Anton Paar MCR 502 rheometer from Anton Paar GmbH (Graz, Austria), using a steady measurement mode, cone-plate geometry with a dimension of 50 mm and truncation of 102 micrometers, at a shear rate of 1 $s^{-1}$ to 100 $s^{-1}$ and a temperature of 23°C. Stated another way, the unfilled resin may have a dynamic viscosity in a range from 10 to 500 cP, from to 400 cP, from 20 to 400 cP, from 20 to 300 cP, from 50 to 300 cP, from 50 to 250 cP, from 50 to 200 cP, from 60 to 200 cP, from 60 to 180 cP, from 60 to 160 cP, from 80 to 160 cP, from 80 to 150 cP, from 80 to 140 cP, from 80 to 120 cP, or even from 90 to 120 cP, when measured at 23°C.

In some embodiments, the resin has a density in a range from 0.7 to 1.4 g/mL, from 0.8 to 1.2 g/mL, from 0.8 to 1.1 g/mL, or even from 0.9 to 1.1 g/mL. As mentioned above, the hollow glass microspheres have a density of no more than 2 g/mL. Optionally, the resin has a density that is close to that of the hollow glass microspheres and the relative density of the resin and the hollow glass microspheres can be described. For instance, the resin may have a density that is within 0.9 g/mL, within 0.8 g/mL, within 0.7 g/mL, within 0.6 g/mL, within 0.5 g/mL, within 0.4 g/mL, within 0.3 g/mL, or even within 0.2 g/mL, of a density of the hollow glass microspheres.

Typically, precursor compositions for making three-dimensional (e.g., electromagnetic radiation altering) articles according to the present disclosure comprise 30 volume percent (vol. %) or greater of the resin comprising an actinic radiation curable component, 35 vol. % or greater, 40 vol. % or greater, 45 vol. % or greater, 50 vol. % or greater, 55 vol. % or greater, 60 vol. % or greater, 65 vol. % or greater, or even 70 vol. % or greater of the resin; and 95 vol. % or less of the resin comprising an actinic radiation curable component, based on the total volume of the precursor composition, 90 vol. % or less, 85 vol. % or less, 80 vol. % or less, 75 vol. % or less, 70 vol. % or less, 65 vol. % or less, 60 vol. % or less, 55 vol. % or less, or 50 vol. % or less of the resin. Stated another way, the precursor composition may comprise from 40 to 95 vol. %, from 45 to 95 vol. %, from 45 to 90 vol. %, from 50 to 90 vol. %, from 60 to 90 vol. %, from 65 to 90 vol. %, from 65 to 85 vol. %, or even from 70 to 85 vol. %, of the resin comprising an actinic radiation curable component.

Typically, the plurality of (e.g., dielectric) hollow glass microspheres is randomly distributed and embedded in the resin. In addition to the hollow glass microspheres, dielectric particles present may further comprise an inorganic material selected from the group consisting of oxides, nitrides, carbides, borides, titanates, zirconates, silicates, and any combinations or mixtures thereof. Exemplary additional suitable dielectric particles are optionally selected from the group consisting of hollow glass microspheres that do not have any surface coating and/or modification, silicon carbides, zirconium oxides, aluminum oxides, (e.g., hexagonal) boron nitride particles, barium titanates, carbon nanotubes, graphite, graphene, polytetrafluoroethylene (PTFE) particles, carbonyl iron particles, sodium bismuth titanates, lead zirconate titanates, calcium zirconates, and any combinations or mixtures thereof. In certain embodiments, optional additional dielectric particles are selected from the group consisting of hollow glass microspheres, silicon carbides, and any combinations or mixtures thereof.

As mentioned above, at least a portion of the hollow glass microspheres (e.g., glass bubbles) comprises a coating or a surface modification. Preferably, an average of 50% or greater of the surface area of the hollow glass microspheres comprises the coating or modification, 60% or greater, 70% or greater, 80% or greater, 90% or greater, 95% or greater, and up to 100% of the surface area of the hollow glass microspheres comprises the coating or modification. In some embodiments, at least part of the surface of the hollow glass microspheres comprises a surface treatment. Typically, such a surface functionalization is selected from the group consisting of hydrophobic and hydrophilic surface functionalization. In some cases, the surface functionalization is selected from the group consisting of amino functionalization and (meth)acrylate functionalization, often preferably (meth)acrylate functionalization. (Meth)acrylate functionality on the glass surface leads to an improved storage stability when the resin used is also based on (meth)acrylates. One suitable type of commercially available hollow glass microspheres having (meth)acrylate functionalization is sold under the trade designation "3M iM16k-MAS-1 Glass Bubbles" from 3M Company (St. Paul, MN), which includes functionalization by methacryloxypropyltrimethoxysilane. In some embodiments, at least part of the surface of the hollow glass microspheres comprises a surface coating, which serves the purpose of shielding electromagnetic waves. For example, the surface coating may be a metal coating selected from the group consisting of aluminum, chromium, iron, titanium, silver, platinum, nickel, copper, zinc, tin, magnesium, cadmium, and any combinations or mixtures thereof. In certain embodiments, the metal is aluminum. A metal coating may be provided by subjecting the hollow glass microspheres to physical vapor deposition (PVD) of the metal onto the microsphere surface. Useful PVD methods include, for example, sputter coating and evaporation coating.

In certain embodiments, the hollow glass microspheres comprise microparticles. In certain embodiments, the hollow glass microspheres have an average diameter (e.g., longest dimension that goes through the center of the microsphere) no greater than 180 micrometers, no greater than 160 micrometers, no greater than 150 micrometers, no greater than 140 micrometers, no greater than 120 micrometers, no greater than 100 micrometers, no greater than 80 micrometers, no greater than 60 micrometers, no greater than 50 micrometers, no greater than 40 micrometers, or even no greater than 20 micrometers. Stated another way, the hollow glass microspheres may have an average diameter in a range from 1 to 200 micrometers, from 2 to 180 micrometers, from 5 to 180 micrometers, from 5 to 160 micrometers, from 5 to 150 micrometers, from 5 to 140 micrometers, from 10 to 140 micrometers, from 10 to 120 micrometers, from 10 to 100 micrometers, from 20 to 100 micrometers, from 20 to 80 micrometers, from 20 to 60 micrometers, from 20 to 50 micrometers, or even from 20 to 40 micrometers.

Although the phrase "hollow glass microsphere" contains the word "sphere", the hollow glass microspheres do not each necessarily have a perfectly spherical shape. A true sphere has an aspect ratio, which is defined as the ratio of the longest dimension of a particle to the smallest dimension of a particle, of 1, because the dimensions (which pass through the center of the object) are all the same. Typically, the hollow glass microspheres used herein have an aspect ratio in a range from 0.8 to 1.2, from 0.9 to 1.2, from 0.9 to 1.1, or even from 0.95 to 1.05.

The presence of the plurality of hollow glass microspheres in the resin tends to increase the viscosity of the actinic radiation curable precursor composition. In practice, the viscosity of the actinic radiation curable precursor composition often needs to be adjusted so that the composition remains stable over a time required to print a three-dimensional object, yet without being so high as to prevent a successful printing process.

The hollow glass microspheres have a density of 2 g/mL or less. Without wishing to be bound by theory, it is believed that the density of the hollow glass microspheres plays a role in decreasing the dielectric constant in which lower dielectric constant values are achieved with lower density hollow glass microspheres. In some cases, the hollow glass microspheres have a density no greater than 1.8 g/mL, no greater than 1.6 g/mL, no greater than 1.5 g/mL, no greater than 1.4 g/mL, no greater than 1.2 g/mL, no greater than 1.0 g/mL, no greater than 0.8 g/mL, no greater than 0.6 g/mL, no greater than 0.5 g/mL, no greater than 0.4 g/mL, or even no greater than 0.2 g/mL; and 0.05 g/mL or greater, 0.1 g/mL or greater, 0.2 g/mL or greater, 0.3 g/mL or greater, or even 0.4 g/mL or greater. Stated another way, the hollow glass microspheres may have a density in a range from 0.05 to 2 g/mL, from 0.05 to 1.8 g/mL, from 0.05 to 1.6 g/mL, from 0.05 to 1.5 g/mL, from 0.1 to 1.5 g/mL, from 0.10 to 1.4 g/mL, from 0.2 to 1.4 g/mL, from 0.2 to 1.2 g/mL, from 0.2 to 1.0 g/mL, from 0.2 to 0.8 g/mL, from 0.4 to 0.8 g/mL, or even from 0.4 to 0.6 g/mL.

Typically, precursor compositions for making three-dimensional (e.g., electromagnetic radiation altering) articles according to the present disclosure comprise 2 volume percent (vol. %) or greater of the hollow glass microspheres, based on the total volume of the precursor composition, 3 vol. % or greater, 4 vol. % or greater, 5 vol. % or greater, 6 vol. % or greater, 8 vol. % or greater, 10 vol. % or greater, 15 vol. % or greater, 20 vol. % or greater, 25 vol. % or greater, 30 vol. % or greater; and 65 vol. % or less of the hollow glass microspheres, based on the total volume of the precursor composition, 60 vol. % or less, 55 vol. % or less, 50 vol. % or less, 45 vol. % or less, vol. % or less, 35 vol. % or less, 30 vol. % or less, 25 vol. % or less, 20 vol. % or less, or even 15 vol. % or less of the hollow glass microspheres, based on the total volume of the precursor composition. Stated another way the precursor composition may comprise the hollow glass microspheres in an amount of 5 to 60 vol. %, from 5 to 55 vol. %, from 10 to 55 vol. %, from 10 to 50 vol. %, from 10 to 45 vol. %, from 10 to 40 vol. %, from 15 to 40 vol. %, from 15 to 35 vol. %, from 20 to 35 vol. %, or even from 25 to 35 vol. %, based on the total volume of the precursor composition.

In certain embodiments, the precursor compositions for making three-dimensional (e.g., electromagnetic radiation altering) articles according to the present disclosure comprise:

a) from 40 to 95 vol. %, from 45 to 95 vol. %, from 45 to 90 vol. %, from 50 to 90 vol. %, from 60 to 90 vol. %, from 65 to 90 vol. %, from 65 to 85 vol. %, or even from 70 to 85 vol. %, of the resin comprising an actinic radiation curable component;

b) from 5 to 60 vol. %, from 5 to 55 vol. %, from 10 to 55 vol. %, from 10 to 50 vol. %, from 10 to 45 vol. %, from 10 to 40 vol. %, from 15 to 40 vol. %, from 15 to 35 vol. %, from 20 to vol. %, or even from 25 to 35 vol. %, of the plurality of hollow glass microspheres; and c) from 0.05 to 5 vol. % of a photoinitiator.

Examples of suitable photoinitiators include those comprising a one component system where two radicals are generated by cleavage, and typically contain a moiety selected from benzoin ether, acetophenone, benzoyl oxime or acyl phosphine. Suitable exemplary photoinitiators are those available under the trade designation OMNIRAD from IGM Resins (Waalwijk, The Netherlands) and include 1-hydroxycyclohexyl phenyl ketone (OMNIRAD 184), 2,2-dimethoxy-1,2-diphenylethan-1-one (OMNIRAD 651), bis(2,4,6 trimethylbenzoyl)phenylphosphineoxide (OMNIRAD 819), 1-[4-(2-hydroxyethoxy)phenyl]-2-hydroxy-2-methyl-1-propane-1-one (OMNIRAD 2959), 2-benzyl-2-dimethylamino-1-(4-morpholinophenyl)butanone (OMNIRAD 369), 2-methyl-1-[4-(methylthio)phenyl]-2-morpholinopropan-1-one (OMNIRAD 907), 2-hydroxy-2-methyl-1-phenyl propan-1-one (OMNIRAD 1173), 2,4,6-trimethylbenzoyldiphenylphosphine oxide (OMNIRAD TPO), and 2,4,6-trimethylbenzoylphenyl phosphinate (OMNIRAD TPO-L). Additional suitable photoinitiators include for example and without limitation, Oligo[2-hydroxy-2-methyl-1-[4-(1-methylvinyl)phenyl]propanone] ESACURE ONE (Lamberti S.p.A., Gallarate, Italy), 2-hydroxy-2-methylpropiophenone, benzyl dimethyl ketal, 2-methyl-2-hydroxypropiophenone, benzoin methyl ether, benzoin isopropyl ether, anisoin methyl ether, aromatic sulfonyl chlorides, photoactive oximes, the photoinitiator TEGO A18 sold by Evonik, and combinations thereof. The photoinitiator may be used in an amount of 0.05 vol. % or greater, 0.1 vol. % or greater, 0.2 vol. % or greater, 0.3 vol. % or greater, 0.4 vol. % or greater, 0.5 vol. % or greater, 0.6 vol. % or greater, 0.7 vol. % or greater, 0.8 vol. % or greater, or 0.9 vol. % or greater, based on the total volume of the actinic radiation curable precursor composition; and 5 vol. % or less, 4.5 vol. % or less, 4 vol. % or less, 3.5 vol. % or less, 3 vol. % or less, 2.5 vol. % or less, 2 vol. % or less, 1.5 vol. % or less, or 1 vol. % or less, based on the total volume of the actinic radiation curable precursor composition. Stated another way, the photoinitiator may be present in an amount of 0.05-5 vol. %, 0.1-5 vol. %, 0.2-5 vol. %, or 0.2-2 vol. %, based on the total volume of the actinic radiation curable precursor composition.

In some embodiments, the actinic radiation curable precursor composition further comprises one or more rheology modifying agents. Suitable rheology modifying agents include particles added in amounts to achieve an actinic radiation curable precursor composition sufficiently stable to additive manufacture an article without substantially separating the hollow glass microspheres from suspension in the resin. Suitable rheology modifying agents include for instance and without limitation, silica particles, fumed alumina particles (e.g., under the trade designations "SpectrA1" and "SpectrA1 100" from Cabot Corporation (Boston, MA)), organic particles (e.g., polyalkyleneoxy terminated polyamide sold under the trade designation "CrystaSense MP" and ester terminated polyamide sold under the trade designation "CrystaSense LP2", both from Croda International Plc (Snaith, England); also additives sold under the trade designations "Rheobyk 410", "Rheobyk 1740 ET", and "Rheobyk R-606", each from BYK Additives & Instruments (Wesel, North Rhine-westphalia, Germany)), and silicates (e.g., phyllosilicate sold under the trade designation "Cloisite 20A" and quaternium-90 sepiolite and quaternium-90 montmorillonite sold under the trade designation "Garamite 7303", both from BYK Additives & Instruments).

Suitable rheology modifying agent silica particles have a primary particle dimension no greater than 100 nm and, therefore, have little to no effect on the penetration of light within the composition during curing. As used herein, the term "primary particle" means a particle in unaggregated form, although the primary particle may be combined with other primary particles to form aggregates on the micron size scale. Silica particles include fused or fumed silicas and may be untreated or treated so as to alter the chemical nature of their surface. Examples of treated fumed silicas include polydimethylsiloxane-treated silicas, hexamethyldisilazane-treated silicas and silicas that are surface treated with alkyltrimethoxysilanes, such as hexyl (C6), octyl (C8), decyl (C10), hexadecyl (C16), and octadecyl (C18) trimethoxysilanes. Commercially available treated silica particles are available from Cabot Corporation under the tradename CAB-O-SIL ND-TS, such as CAB-O-SIL TS 720, 710, 610, 530, and Degussa Corporation under the tradename AEROSIL, such as AEROSIL R805. Of the untreated silica particles, amorphous and hydrous silicas may be used. Commercially available amorphous silica particles include AEROSIL 300 with an average particle size of the primary particles of about 7 nm, AEROSIL 200 with an average particle size of the primary particles of about 12 nm, AEROSIL 130 with an average size of the primary particles of about 16 nm. Commercially available hydrous silica particles include NIPSIL E150 with an average particle size of 4.5 nm, NIPSIL E200A with and average particle size of 2.0 nm, and NIPSIL E220A with an average particle size of 1.0 nm (manufactured by Japan Silica Kogya Inc.).

In some embodiments, the composition comprises rheology modifying agent (e.g., silica) particles in an amount of 0.5 wt. % or greater, based on the total weight of the actinic radiation curable precursor composition, 1 wt. % or greater, 1.5 wt. % or greater, 2 wt. % or greater, 2.5 wt. % or greater, 3 wt. % or greater, or 3.5 wt. % or greater; and 10 wt. % or less, 9 wt. % or less, 8 wt. % or less, 7 wt. % or less, 6 wt. % or less, 5 wt. % or less, or 4 wt. % or less rheology modifying agent (e.g., silica) particles, based on the total weight of the actinic radiation curable precursor composition. In some cases, 0.5-10 wt. %, 1-10 wt. %, 2-10 wt. %, or 2-5 wt. % of one or more types of silica particles may be included in the total weight of the actinic radiation curable precursor composition as a rheology modifying agent.

One or more dispersants can optionally be used to improve the processing of the actinic radiation curable precursor composition and to facilitate loading of the hollow glass microspheres into the resin. Suitable dispersants include those available under the trade designations "BYK 9077," "DISPERBYK 161," "DISPERBYK 168," "DISPERBYK 180," "DISPERBYK 2050," "DISPERBYK 2055," "DISPERBYK 2151," "DISPERBYK 2152," and "DISPERBYK 2155" from BYK-Gardner USA, Wallingford, CT; "EFKA PX-4047," "EFKA PX-4050," "EFKA PX-4061," "EFKA PX-4300," "EFKA PX-4340," "EFKA PX-4401," "EFKA PX-4700," "EFKA PX-4701," and "EFKA PX-4401" from BASF Corporation, Florham Park, NJ; and "SOLSPERSE 24000," "SOLSPERSE 28000," "SOLSPERSE 32000," "SOLSPERSE 39000," "SOLSPERSE 71000," "SOLSPERSE 74000," "SOLSPERSE 88000," "SOLSPERSE J200," "SOLSPERSE M387," "SOLSPERSE M388," "SOLSPERSE M389," "SOLPLUS D510," and "SOLPLUS R700" from Lubrizol Corporation, Wickliffe, OH. The dispersant, if present, may be used in an amount of 0.1 wt. % or greater, 0.2 wt. % or greater, 0.3 wt. % or greater, 0.4 wt. % or greater, 0.5 wt. % or greater, 0.6 wt. % or greater, 0.7 wt. % or greater, 0.8 wt. % or greater, or 0.9 wt. % or greater, based on the total weight of the actinic radiation curable precursor composition; and 5 wt. % or less, 4.5 wt. % or less, 4 wt. % or less, 3.5 wt. % or less, 3 wt. % or less, 2.5 wt. % or less, 2 wt. % or less, 1.5 wt. % or less, or 1 wt. % or less, based on the total weight of the actinic radiation curable precursor composition. Stated another way, the optional dispersant may be present in an amount of 0.1-5 wt. %, 0.2-5 wt. %, 0.5-5 wt. %, or 0.5-2 wt. %, based on the total weight of the actinic radiation curable precursor composition.

Moreover, one or more ultraviolet absorbing additives are included in the actinic radiation curable precursor composition to achieve improved light control during curing of the composition. In some embodiments, the ultraviolet absorber is one or more selected from a group consisting of a salicyl ester ultraviolet absorber, a benzophenone ultraviolet absorber, a benzotriazole ultraviolet absorber, and a triazine ultraviolet absorber. Suitable salicyl ester ultraviolet absorbers include one or more selected from a group consisting of methyl salicylate, ethyl salicylate and octyl salicylate. Suitable benzophenone ultraviolet absorbers include one or more selected from a group consisting of 2-hydroxy-4-methoxybenzophenone and 2-hydroxy-4-n-octyloxybenzophenone. Suitable benzotriazole ultraviolet absorbers include one or more selected from a group consisting of 2-(2'-hydroxy-3',5'-di-tert-phenyl)-5-chlorobenzotriazole and 2-(2'-hydroxy-5'-methylphenyl) benzotriazole. One commercially available ultraviolet absorber is LUMILUX Blue LZ, which is a pigment available from Honeywell International Inc. (Charlotte, NC). The ultraviolet absorber, if present, may be used in an amount of 0.1 wt. % or greater, 0.2 wt. % or greater, 0.3 wt. % or greater, 0.4 wt. % or greater, 0.5 wt. % or greater, 0.6 wt. % or greater, 0.7 wt. % or greater, 0.8 wt. % or greater, or 0.9 wt. % or greater, based on the total weight of the actinic radiation curable precursor composition; and 5 wt. % or less, 4.5 wt. % or less, 4 wt. % or less, 3.5 wt. % or less, 3 wt. % or less, 2.5 wt. % or less, 2 wt. % or less, 1.5 wt. % or less, or 1 wt. % or less, based on the total weight of the actinic radiation curable precursor composition. Stated another way, the optional ultraviolet absorber may be present in an amount of 0.1-5 wt. %, 0.2-5 wt. %, 0.5-5 wt. %, or 0.5-2 wt. %, based on the total weight of the actinic radiation curable precursor composition.

Articles

In a second aspect, the present disclosure provides a (e.g., three-dimensional) article. The article comprises a photo(co) polymerization reaction product of the composition according to the first aspect. In particular, any detail(s) of the actinic radiation curable precursor composition described above may be employed to prepare the article of this second aspect.

Preferably, the article is an electromagnetic radiation altering article. Exemplary suitable electromagnetic radiation altering features of electromagnetic radiation altering articles may be selected from the group consisting of electromagnetic lenses, diffractive gratings, frequency selective surfaces or materials, electromagnetic energy absorbers, metamaterials, and any combinations thereof. In select embodiments, the electromagnetic radiation altering features are electromagnetic lenses, redirectors and/or electromagnetic energy absorbers.

Articles according to at least certain embodiments of the present disclosure advantageously exhibit electromagnetic radiation altering characteristics. For instance, the article may be capable of modifying (e.g., interfering with) electromagnetic radiation originating from an electromagnetic radiation producing device at a frequency F1. In some embodiments, the frequency F1 at which the dielectric properties of the electromagnetic radiation altering article are measured is in a range from 300 MHz to 300 GHz. In some embodiments, the frequency F1 is in a range from 300 MHz to 3 GHz (e.g., Ultra High Frequency (UHF)). In some embodiments, the frequency F1 is in a range from 3 GHz to 30 GHz (e.g., Super High Frequency (SHF)). In some embodiments, the frequency F1 is in a range from 30 GHz to 300 GHz (e.g., Extremely High Frequency (EHF)). In some embodiments, the frequency F1 is in a range from 1 to 10 GHz, from 1 to 8 GHz, from 1 to 6 GHz, or even from 2 to 6 GHz (e.g., a 5G mid GHz range).

Electromagnetic radiation altering characteristics can be determined. For instance, in some cases, an article containing metal coated hollow glass microspheres alters a direction of electromagnetic waves directed at the article, when the frequency of the application of the electromagnetic waves is less than 1 gigahertz (GHz).

A suitable transmission and/or reflection method can be realized using conductive or radiative methods. Conductive transmission and/or reflective methods include coaxial or waveguide transmission line methods. Radiative transmission and/or reflective methods include free-field measurement setups in an anechoic RF measurement chamber and quasi-optical methods using reflectors and lenses or a combination thereof.

A suitable dielectric resonance method (e.g., split post dielectric resonator) is described in detail in the examples below, as the "Dielectric Resonance (SPDR) Measurement Method".

A suitable capacitance method includes measurement of a well-known test capacitor-structure with an exchangeable dielectric medium between the plates and measuring the change in capacitance conducted by the different dielectric materials.

A suitable LC resonance method (or U/I method) includes use of an LCR meter to determine the resonance properties of a combined RLC Circuit, exchanging the dielectric material of the associated Capacitor with the material under test and calculating the dielectric properties from the resulting differences of the resonance properties.

A suitable perturbation method includes measurement of the resonance properties of a cavity resonator, monitoring the change of resonance properties when inserting a dielectric sample and calculating dielectric properties from the perturbation of resonance properties.

A suitable open resonator method includes usage e.g. of a Fabry-Perot open resonator.

In some cases, an article has a relative permittivity ($\varepsilon_r$) of no greater than 3, no greater than 2.8, no greater than 2.6, no greater than 2.5, no greater than 2.4, no greater than 2.2, no greater than 2, or even no greater than 1.5, when measured at 2.4 GHz according to the Dielectric Resonance (SPDR) Measurement Method, which is described in detail in the examples below. In some cases, an article has a relative permittivity (C r) of no greater than 3, no greater than 2.8, no greater than 2.6, no greater than 2.5, no greater than 2.4, no greater than 2.2, no greater than 2, or even no greater than 1.5, when measured at 5.2 GHz according to the Dielectric Resonance (SPDR) Measurement Method.

In some cases, an article has a dielectric loss tangent (tan delta) of no greater than 0.040, no greater than 0.038, no greater than 0.036, no greater than 0.034, no greater than 0.032, no greater than 0.030, no greater than 0.028, no greater than 0.026, no greater than 0.024, no greater than 0.022, no greater than 0.020, no greater than 0.016, no greater than 0.012, no greater than 0.008, or even no greater than 0.004, when measured at 2.4 GHz according to the Dielectric Resonance (SPDR) Measurement Method. In some cases, an article has a dielectric loss tangent (tan delta)

of no greater than 0.040, no greater than 0.038, no greater than 0.036, no greater than 0.034, no greater than 0.032, no greater than 0.030, no greater than 0.028, no greater than 0.026, no greater than 0.024, no greater than 0.022, no greater than 0.020, no greater than 0.016, no greater than 0.012, no greater than 0.008, or even no greater than 0.004, when measured at 5.2 GHz according to the Dielectric Resonance Measurement Method.

In some cases, an article containing metal coated hollow glass microspheres has a relative permittivity ($\varepsilon_r$) of greater than 5, greater than 6, greater than 7, greater than 8, greater than 9, or even greater than 10, when measured at 2.4 GHz according to the Dielectric Resonance (SPDR) Measurement Method. In some cases, an article containing metal coated hollow glass microspheres has a relative permittivity ($\varepsilon_r$) of greater than 5, greater than 6, greater than 8, greater than 10, greater than 12, or even greater than 14, when measured at 5.2 GHz according to the Dielectric Resonance (SPDR) Measurement Method.

In some cases, an article containing metal coated hollow glass microspheres has a dielectric loss tangent (tan delta) of greater than 0.06, greater than 0.08, greater than 0.10, greater than 0.12, or even greater than 0.14, when measured at 2.4 GHz according to the Dielectric Resonance (SPDR) Measurement Method. In some cases, an article containing metal coated hollow glass microspheres has a dielectric loss tangent (tan delta) of greater than 0.06, greater than 0.08, greater than 0.10, greater than 0.12, greater than 0.14, greater than 0.16, greater than 0.18, greater than 0.20, or even greater than 0.22, when measured at 5.2 GHz according to the Dielectric Resonance (SPDR) Measurement Method.

Methods of Manufacturing Three-Dimensional Articles

In a third aspect, a method of manufacturing a three-dimensional article is provided. The method comprises the steps of:

a) providing an actinic radiation curable precursor composition according to the first aspect; and
b) selectively exposing a portion of the actinic radiation curable precursor composition to a source of actinic radiation to at least partially cure the exposed portion of the actinic radiation curable precursor composition, thereby forming a cured layer, wherein steps a) and b) are repeated so as to form a three-dimensional article.

Figure 8:
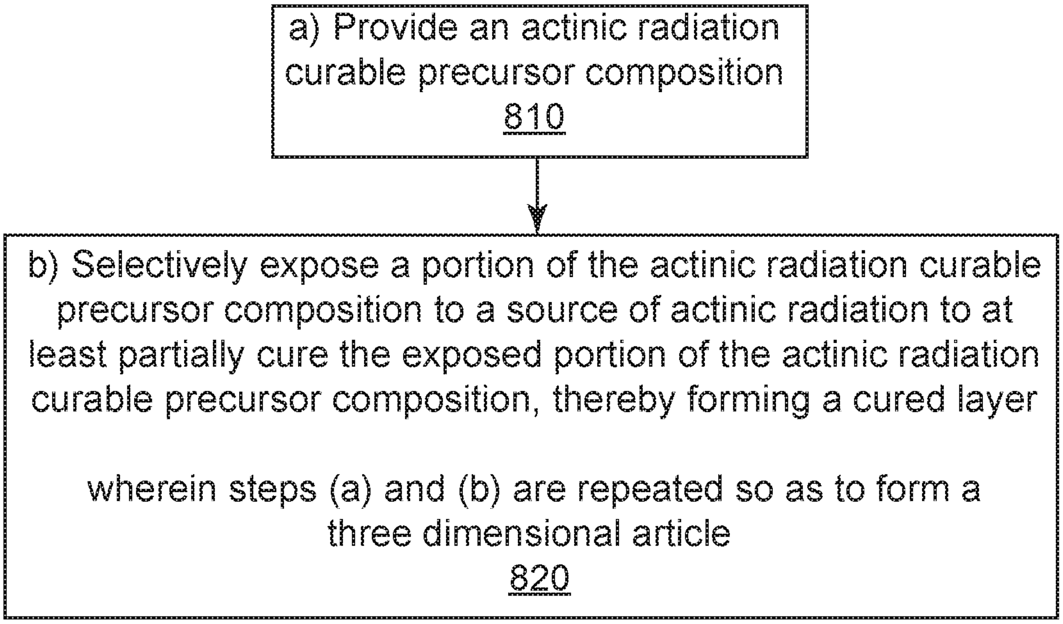
FIG. 8 is a flow chart of an exemplary method of manufacturing an article according to the present disclosure.

Referring to FIG. 8, a flow chart is provided of the method of the third aspect. More particularly, the method comprises Step 810 to (a) provide an actinic radiation curable precursor composition. The actinic radiation curable precursor composition is according to any embodiment of the first aspect described in detail above. The method further comprises Step 820 to (b) selectively expose a portion of the actinic radiation curable precursor composition to a source of actinic radiation to at least partially cure the exposed portion of the actinic radiation curable precursor composition, thereby forming a cured layer, wherein steps (a) and (b) are repeated so as to form a three-dimensional article.

In a fourth aspect, a three-dimensional article is provided. The three-dimensional article is obtained according to the method of the third aspect. Preferably, the three-dimensional article is an electromagnetic radiation altering article. For instance, the article may be capable of modifying (e.g., interfering with) electromagnetic radiation originating from an electromagnetic radiation producing device at a frequency F1, wherein F1 is as described above with respect to the article of the second aspect.

In some embodiments, the step of additive manufacturing the electromagnetic radiation altering article based on the simulation of the electromagnetic radiation altering article is performed using an additive manufacturing method selected from the group consisting of stereolithography (SLA) (e.g., vat polymerization), digital light processing (DLP), and any combinations thereof. In certain embodiments, the additive manufacturing method employed comprises stereolithography (SLA). In certain embodiments, the additive manufacturing method comprises digital light processing (DLP). In certain embodiments, the additive manufacturing method comprises material jetting.

Methods of printing a three-dimensional object described herein can include forming the article from a plurality of layers of an actinic radiation curable precursor composition described herein in a layer-by-layer manner. Further, the layers of a build material composition can be deposited according to an image of the three-dimensional object in a computer readable format. In some or all embodiments, the actinic radiation curable precursor composition is deposited according to preselected computer aided design (CAD) parameters (e.g., a data file).

It is to be understood that methods of manufacturing a three-dimensional object described herein can include so-called "stereolithography/vat polymerization" 3D printing methods. Other techniques for three-dimensional manufacturing are known and may be suitably adapted to use in the applications described herein. More generally, three-dimensional fabrication techniques continue to become available. All such techniques may be adapted to use with actinic radiation curable precursor compositions described herein, provided they offer compatible fabrication viscosities and resolutions for the specified article properties. Fabrication may be performed using any of the fabrication technologies described herein, either alone or in various combinations, using data representing a three-dimensional object, which may be reformatted or otherwise adapted as necessary for a particular printing or other fabrication technology.

It is entirely possible to form a three-dimensional object from a actinic radiation curable precursor composition using vat polymerization (e.g., stereolithography). For example, in some cases, a method of printing a three-dimensional object comprises retaining a actinic radiation curable precursor composition described herein in a fluid state in a container and selectively applying energy to the actinic radiation curable precursor composition in the container to solidify at least a portion of a fluid layer of the actinic radiation curable precursor composition, thereby forming a hardened layer that defines a cross-section of the three-dimensional object. Additionally, a method described herein can further comprise raising or lowering the hardened layer to provide a new or second fluid layer of unhardened actinic radiation curable precursor composition at the surface of the fluid in the container, followed by again selectively applying energy to the actinic radiation curable precursor composition in the container to solidify at least a portion of the new or second fluid layer of the actinic radiation curable precursor composition to form a second solidified layer that defines a second cross-section of the three-dimensional object. Further, the first and second cross-sections of the three-dimensional object can be bonded or adhered to one another in the z-direction (or build direction corresponding to the direction of raising or lowering recited above) by the application of the energy for solidifying the actinic radiation curable precursor composition. Moreover, selectively applying energy to the actinic radiation curable precursor composition in the container can comprise applying actinic radiation, such as UV radiation, visible radiation, or e-beam radiation, having a sufficient energy to cure the actinic radiation curable precursor composition. A method can also comprise planarizing a new layer of fluid actinic radiation curable precursor composition provided by raising or lowering an elevator platform. Such planarization can be carried out, in some cases, by utilizing a wiper or roller or a recoater. Planarization corrects the thickness of one or more layers prior to curing the material by evening the dispensed material to remove excess material and create a uniformly smooth exposed or flat up-facing surface on the support platform of the printer.

It is further to be understood that the foregoing process can be repeated a selected number of times to provide the three-dimensional object. For example, in some cases, this process can be repeated "n" number of times. Further, it is to be understood that one or more steps of a method described herein, such as a step of selectively applying energy to a layer of actinic radiation curable precursor composition, can be carried out according to an image of the three-dimensional object in a computer-readable format. Suitable stereolithography printers include the Viper Pro SLA, available from 3D Systems, Rock Hill, SC and the Asiga PICO PLUS 39, available from Asiga USA, Anaheim Hills, CA.

Figure 2:
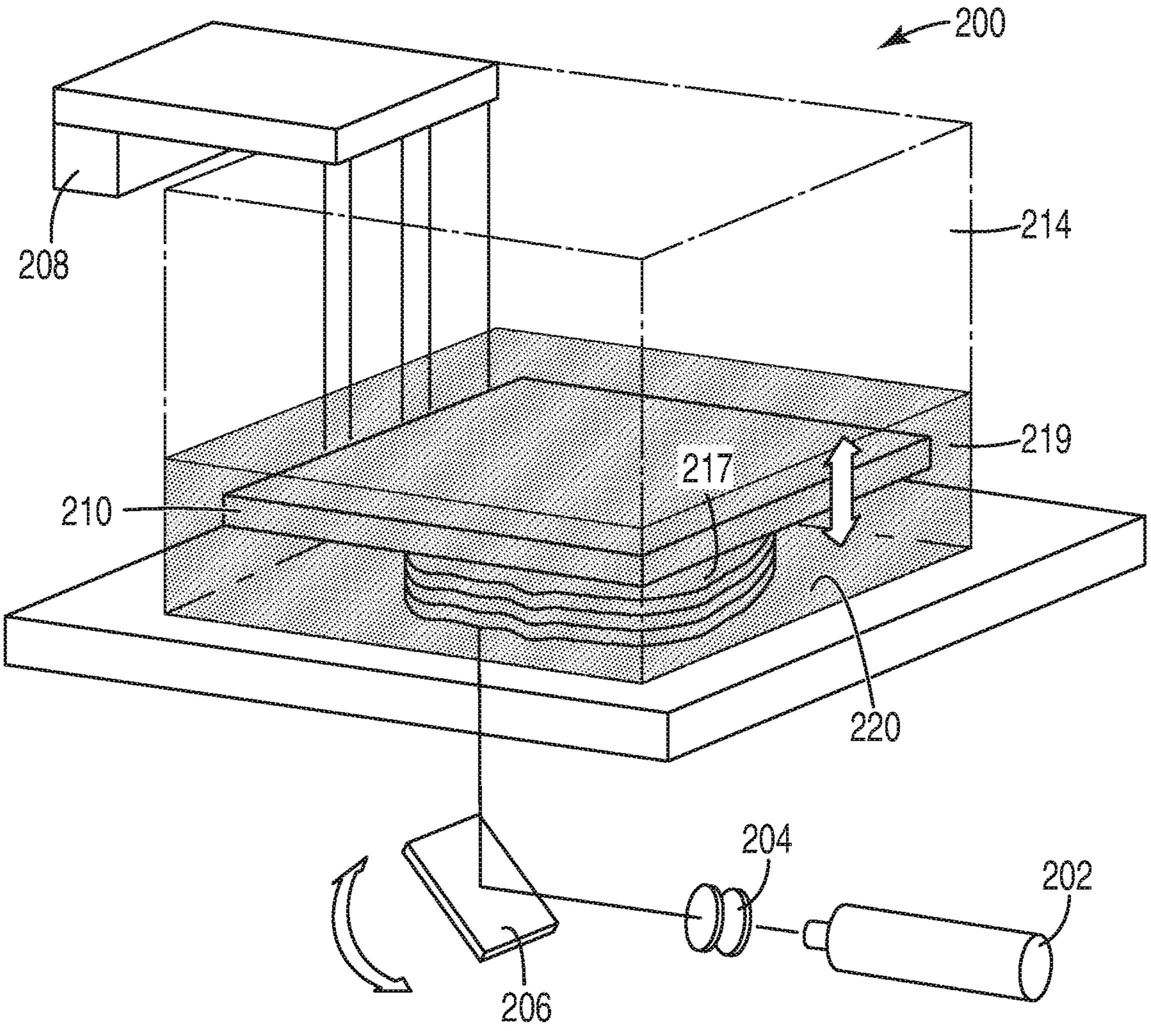
FIG. 2 is a schematic perspective view of an additive manufacturing apparatus.

FIG. 2 shows a stereolithography apparatus ("SLA") that may be used, for instance with the actinic radiation curable precursor compositions and methods described herein. In general, the apparatus 200 may include a laser 202, optics 204, a steering mirror or lens 206, an elevator 208, and a platform 210, within a vat 214 filled with the actinic radiation curable precursor composition 219. In operation, the laser 202 is steered through a wall 220 (e.g., the floor) of the vat 214 and into the actinic radiation curable precursor composition to cure a cross-section of the actinic radiation curable precursor composition 219 to form an article 217, after which the elevator 208 slightly raises the platform 210 and another cross section is cured. Suitable stereolithography printers include the NextDent 5100 and the FIG. 4, both available from 3D Systems, Rock Hill, SC, and the Asiga PICO PLUS 39, available from Asiga USA, Anaheim Hills, CA.

In some embodiments, vat polymerization with Digital Light Processing ("DLP"), employs a container of actinic radiation curable precursor composition. In a DLP based system, a two-dimensional cross section is projected onto the curable material to cure the desired section of an entire plane transverse to the projected beam at one time. One suitable apparatus for use with photopolymerizable compositions is the Rapid Shape D40 II DLP 3D printer (Rapid Shape GmbH, Heimsheim, Germany). All such curable systems as may be adapted to use with the actinic radiation curable precursor compositions described herein are intended to fall within the scope of "vat polymerization" or "stereolithography" systems as used herein. In certain embodiments, an apparatus adapted to be used in a continuous mode may be employed, such as an apparatus commercially available from Carbon 3D, Inc. (Redwood City, CA), for instance as described in U.S. Pat. Nos. 9,205,601 and 9,360,757 (both to DeSimone et al.).

Data representing a three-dimensional article (e.g., an electromagnetic radiation altering article) may be generated using computer modeling, such as computer aided design (CAD) data. Image data representing the article design can be exported in STL format, or in any other suitable computer processable format, to the additive manufacturing equipment.

Figure 7:
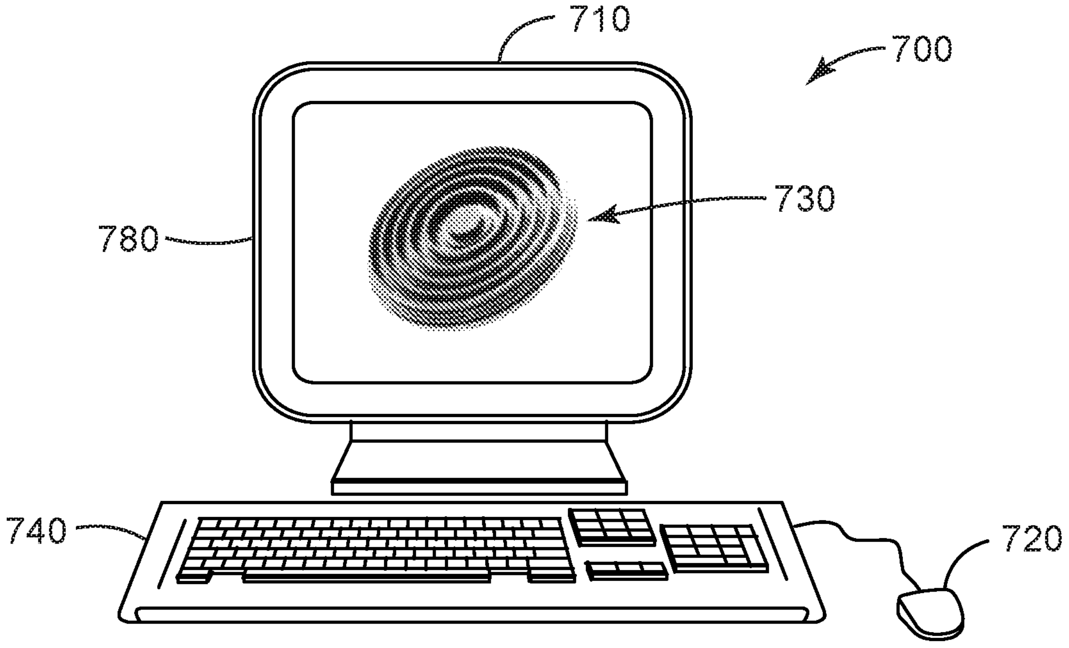
FIG. 7 is a schematic front view of an exemplary computing device.

Often, machine-readable media are provided as part of a computing device. The computing device may have one or more processors, volatile memory (RAM), a device for reading machine-readable media, and input/output devices, such as a display, a keyboard, and a pointing device. Further, a computing device may also include other software, firmware, or combinations thereof, such as an operating system and other application software. A computing device may be, for example, a workstation, a laptop, a personal digital assistant (PDA), a server, a mainframe or any other general-purpose or application-specific computing device. A computing device may read executable software instructions from a computer-readable medium (such as a hard drive, a CD-ROM, or a computer memory), or may receive instructions from another source logically connected to a computer, such as another networked computer. Referring to FIG. 7, a computing device 700 often includes an internal processor 780, a display 710 (e.g., a monitor), and one or more input devices such as a keyboard 740 and a mouse 720. In FIG. 7, an article 730 (e.g., a lens) is shown on the display 710.

Figure 3:
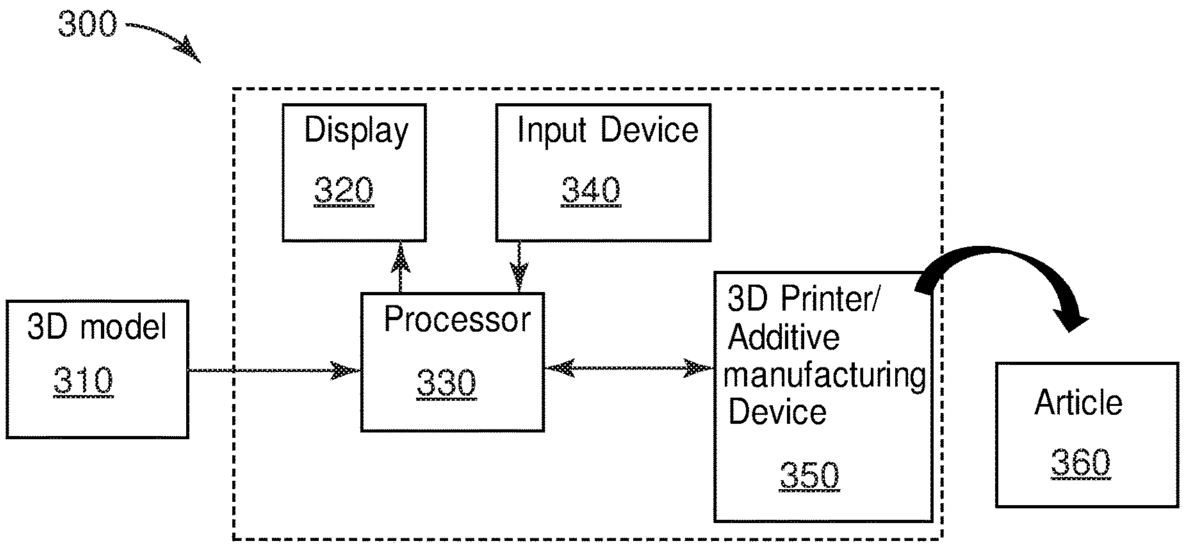
FIG. 3 is a block diagram of a generalized system for additive manufacturing of an article.

Referring to FIG. 3, in certain embodiments, a system 300 is employed in the method of manufacturing an (e.g., electromagnetic radiation altering) article. The system 300 comprises a display 320 that displays a 3D model 310 of an article (e.g., an article 730 as shown on the display 710 of FIG. 7); and one or more processors 330 that, in response to the 3D model 310 selected by a user, cause a 3D printer/additive manufacturing device 350 to create a physical object of the article 360. Often, an input device 340 (e.g., keyboard and/or mouse) is employed with the display 320 and the at least one processor 330, particularly for the user to select the 3D model 310.

Figure 4:
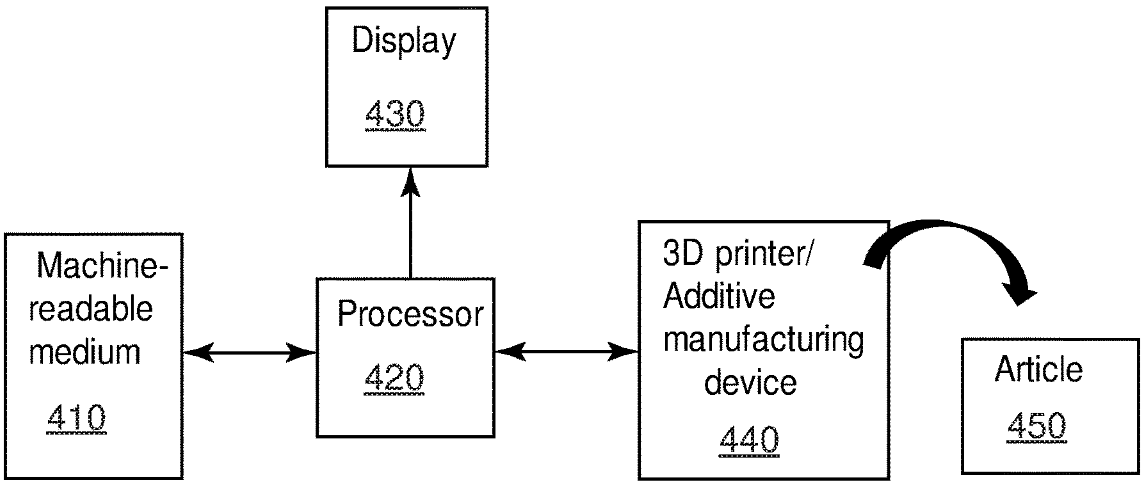
FIG. 4 is a block diagram of a generalized manufacturing process for an article.

Referring to FIG. 4, a processor 420 (or more than one processor) is in communication with each of a machine-readable medium 410 (e.g., a non-transitory medium), a 3D printer/additive manufacturing device 440, and optionally a display 430 for viewing by a user. The 3D printer/additive manufacturing device 440 is configured to make one or more articles 450 based on instructions from the processor 420 providing data representing a 3D model of the article 450 (e.g., an article 730 as shown on the display 710 of FIG. 7) from the machine-readable medium 410.

Figure 5:
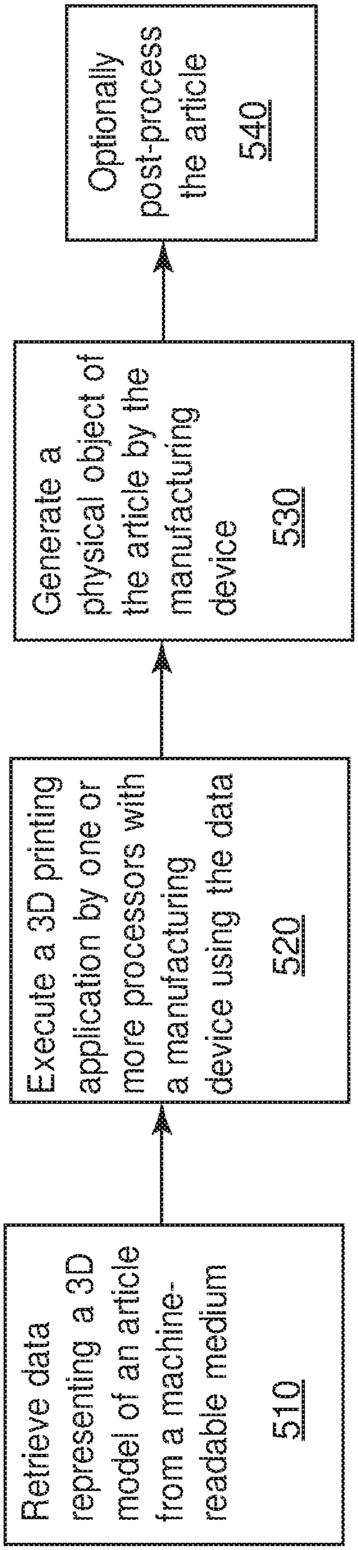
FIG. 5 is a high-level flow chart of an exemplary article manufacturing process.

Referring to FIG. 5, for example and without limitation, an additive manufacturing method comprises retrieving 510, from a (e.g., non-transitory) machine-readable medium, data representing a 3D model of an article according to at least one embodiment of the present disclosure. The method further includes executing 520, by one or more processors, an additive manufacturing application interfacing with a manufacturing device using the data; and generating 530, by the manufacturing device, a physical object of the article. One or more various optional post-processing steps 540 may be undertaken. Typically, uncured actinic radiation curable precursor is removed from the article, plus the article may further be heat treated or otherwise post-cured. For instance, in some embodiments, the method further comprises, prior to Step c): retrieving, from a non-transitory machine readable medium, data representing a 3D model of the three-dimensional article; and executing, by one or more processors, a 3D printing application interfacing with a manufacturing device using the data to generate a physical object of the three-dimensional article.

Figure 6:
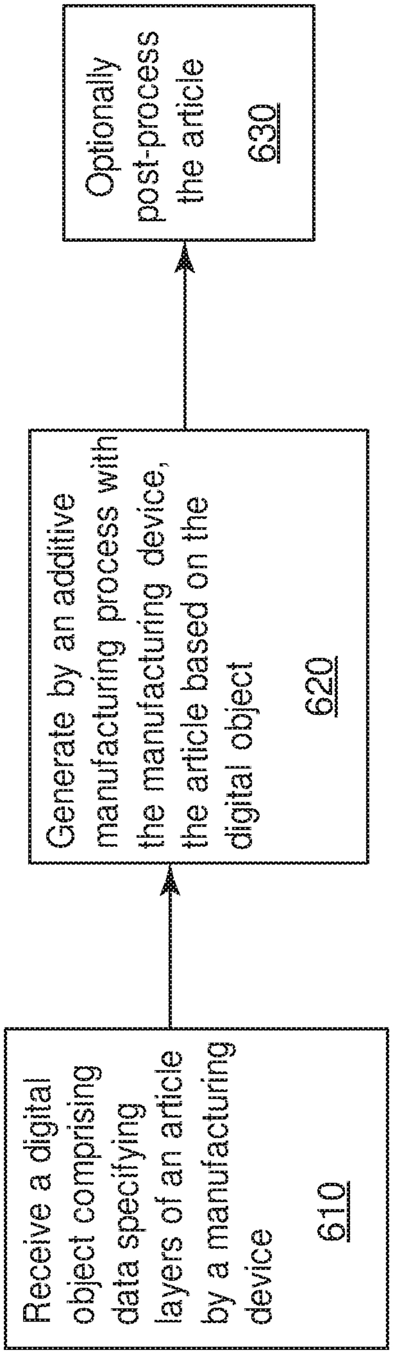
FIG. 6 is a high-level flow chart of an exemplary article additive manufacturing process.

Additionally, referring to FIG. 6, a method of making an article comprises receiving 610, by a manufacturing device having one or more processors, a digital object comprising data specifying an (e.g., three-dimensional) article; and generating 620, with the manufacturing device by an additive manufacturing process, the article based on the digital object. Again, the article may undergo one or more steps of post-processing 630. For instance, in some embodiments, the method further comprises, prior to Step c): receiving, by a manufacturing device having one or more processors, a digital object comprising data specifying the three-dimensional article; and generating, with the manufacturing device by an additive manufacturing process, the three-dimensional article based on the digital object.

An electromagnetic radiation altering article according to the present disclosure may be useful for industrial applications, such as electronic applications, telecommunication applications, and transportation market applications (e.g., automotive and aerospace applications).

Methods of Altering Electromagnetic Radiation

In a fifth aspect, the present disclosure provides a method of interfering with electromagnetic radiation originating from an electromagnetic radiation producing device and received by an electronic device. The method comprises the step of integrating an (e.g., three-dimensional) article according to the second aspect or the fourth aspect into the electronic device or placing an article according to the second aspect or the fourth aspect in the vicinity of the electronic device. Similarly, in a sixth aspect, the present disclosure provides a method of interfering with electromagnetic radiation originating from an electromagnetic radiation producing device. The method comprises the step of integrating an article according to the second aspect or the fourth aspect into the electronic device or placing an article according to the second aspect or the fourth aspect in the vicinity of the electromagnetic radiation producing device.

Typically, the electromagnetic radiation producing device is considered to be an interferer or a transmitter and the receiving electronic device is considered to be a victim or a receiver. In some embodiments, the electronic device or the electromagnetic radiation producing device is selected from the group consisting of an antenna, an internet connected device, a smartphone, a tablet PC, a TV, a communication satellite, a wireless transmitter, a wireless router, a wireless amplifier, an autonomous driving assisting device, and any combinations thereof. The placement of the (e.g., electromagnetic radiation altering) article can be selected to be between a device that emits electromagnetic radiation and a device or material that desired to be protected from effects of the emitted electromagnetic radiation. The (e.g., electromagnetic radiation altering) article can thus reflect, attenuate, redirect, or any combination thereof, the emitted electromagnetic radiation to decrease the amount of electromagnetic radiation that reaches (e.g., is received by) the device or material to be protected (e.g., the victim) from the emitting device.

In some methods, the article according to any of the embodiments described above is associated with or near an electronic device to decrease electromagnetic radiation directed at the electronic device coming from the electromagnetic radiation producing devices, in which case the electronic device is a "victim". When the electronic device is a victim, the article shields the electronic device from undesired electromagnetic radiation, which may be either intentionally or unintentionally directed toward the electronic device from the electromagnetic radiation producing devices. In some methods, the article according to any of the embodiments described above is associated with or near an electronic device to redirect electromagnetic radiation to the electronic device emitted from the electromagnetic radiation producing devices, in which case the electronic device is a "receiver" (as opposed to a "victim"). One example of such a method would be to enable reception of a signal (e.g., 5G signals) in urban surroundings by reflecting the electromagnetic radiation in certain directions towards the electronic device.

The following Examples are set forth to describe additional features and embodiments of the invention.

EXAMPLES

Objects and advantages of this invention are further illustrated by the following examples, but the particular materials and amounts thereof recited in these examples, as well as other conditions and details, should not be construed to unduly limit this invention. These examples are merely for illustrative purposes only and are not meant to be limiting on the scope of the appended claims. Unless otherwise noted or readily apparent from the context, all parts, percentages, ratios, etc. in the Examples and the rest of the specification are by volume.

Materials Used in the Examples

| Abbreviation | Description and Source |
|---|---|
| isopropanol | Isopropanol, obtained from Merck, Darmstadt, Germany |
| iM16k-MAS-1 | iM16k-MAS-1 glass bubbles functionalized with methacryloxypropyltrimethoxysilane, obtained from 3M, St. Paul, MN |
| S28HS | S28HS glass bubbles, obtained from 3M, St. Paul, MN |
| Cab-O-Sil TS 720 | Cab-O-Sil TS 720 fumed silica, obtained from Cabot Corporation, Boston, MA |
| SR540 | Ethoxylated (4) bisphenol a methacrylate SR540, obtained from Sartomer, Colombes, France |
| TRGDMA | Triethyleneglycol dimethacrylate, obtained from Merck, Darmstadt, Germany |
| MA1 | Mixture of 2-hydroxyethyl methacrylate, 2,6-di-tert-butyl-p-cresol, 4-methoxyphenol, and polyurethane methacrylate (DESMA), with DESMA being the majority component, obtained from 3M, St. Paul, MN |
| MA2 | Mixture of tetrahydrofuran and oxirane copolymer, bis(2-methyl-2-propenoate), and methacrylic acid, prepared according to paragraphs [0032]-[0034] (Beispiel 1 (Prepolymer)) of EP0670341B1 |
| HPMA | Mixture of hydroxypropyl and hydroxyisopropyl methacrylates, obtained from Merck, Darmstadt, Germany |
| OMNIRAD 819 | Bis(2,4,6-Trimethylbenzoyl)phenylphosphine oxide, having the trade designation OMNIRAD 819, obtained from IGM Resins, Waalwijk, Netherlands |
| 3D printing resin | A mixture consisting of 38.4 wt. % SR540, 38.4 wt. % TRGDMA, 13.2 wt. % MA1, 8 wt. % HPMA, and 2 wt. % MA2 |

Methods

Dielectric Resonance (SPDR) Measurement Method

Dielectric constant and loss tangents of the material sample were measured using Split Post Dielectric Resonators (SPDR) in combination with a network analyzer. The nominal frequencies of the used SPDR are 2.4 gigahertz and 5.2 gigahertz.

Measurement Procedure:

Calibration of network analyzer

Coupling adjustment of the SPDR with the network analyzer.

Measurement of the empty SPDR (resonant frequency, Q-factor)

Measurement of the SPDR with material sample (resonant frequency, Q-factor)

Measurement of the sample thickness

Calculation of the complex dielectric parameters with SPDR specific software

The accuracy for a sample with the thickness of h is:

$\Delta\varepsilon/\varepsilon=\pm(0.0015+\Delta h/h)$ $\Delta$ tan $\delta=\pm 2*10{-}5$ or $\pm 0.03*\tan\delta$, whichever is higher The material sample size for both SPDR should be 50 millimeters×40 millimeters×<0.5 millimeters.

For measurements of the dielectric properties below (and including) 1 gigahertz, the following procedure was used:

Dielectric constant and loss tangents were measured using an impedance analyzer covering the frequency range of 1 megahertz to 1 gigahertz. To measure material properties, the analyzer was extended with a measurement fixture. The fixture for measurement of dielectric properties is converting the material parameters to a measurable impedance by using the principle of a parallel plate capacitor. The used measurement fixture can measure the frequency dependent dielectric constant (Dk) and the loss tangent (real and imaginary part of the impedance) in a frequency range from 1 megahertz to 1 gigahertz.

For most accurate results, the material under test (MUT) was prepared in discs with a thickness of 0.3 millimeters to 3 millimeters and a diameter ≥15 millimeters.

Calibration was performed with the vendor supplied calibration artefacts at the spot of the material measurement.

The exact thickness of each sample disc was measured using a caliper. With known values for impedance and thickness, a calculation can be performed to get the complex value for permittivity.

Figure 9:
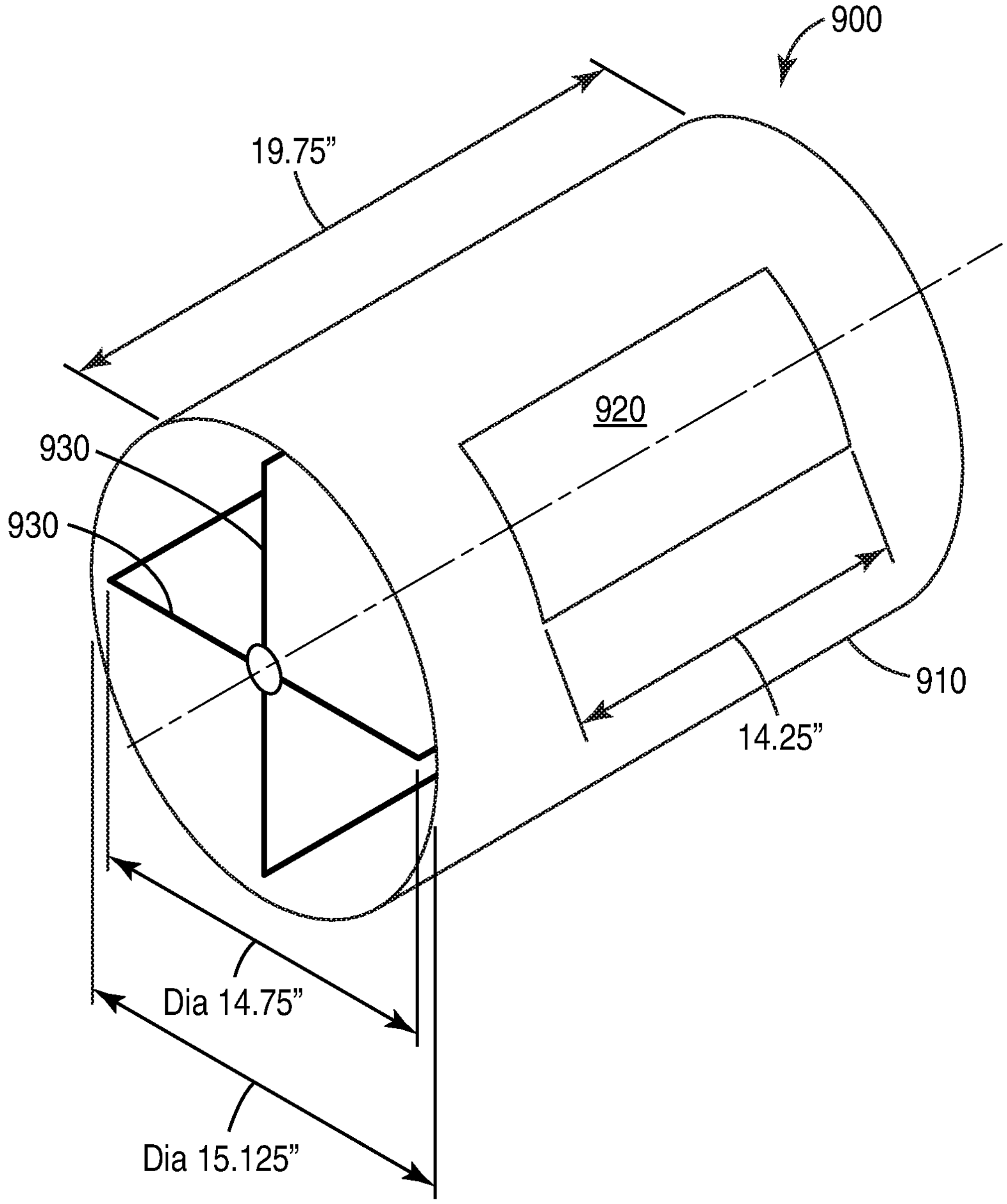
FIG. 9 is a schematic perspective view of a chamber used to prepare the aluminum-coated hollow glass microspheres of Preparative Example 1.

Preparation of Aluminum thin film coated S28 Glass bubbles by Physical Vapor Deposition A physical vapor deposition (PVD) method of metallizing particles can include magnetron sputtering as disclosed in for example, U.S. Pat. Nos. 4,612,242, 7,727,931, and 8,698,394. An aluminum (1100) sputter target was used to produce a thin film coated onto glass bubbles. The apparatus used in the following examples for the preparation of aluminum thin film coated S28HS glass bubbles is similar the one described in U.S. Pat. No. 8,698,394, except the particle agitator is also the chamber. A schematic perspective view of the chamber 900 is provided in FIG. 9. Dimensions of the cylindrical chamber 900 include a length of 19¾ inches, a diameter of 15⅛ inches, and a rectangular sputtering opening 920 in the wall 910 of the chamber 900 having a length of 14½ inches. Four rectangular blades 930 within the chamber 900 each have a width of about 7⅜ inches. A rectangular metal sputter target (not shown) has dimensions of 5 inches×12 inches and is located 2½ inches away from the sputtering opening 920.

Figure 10A:
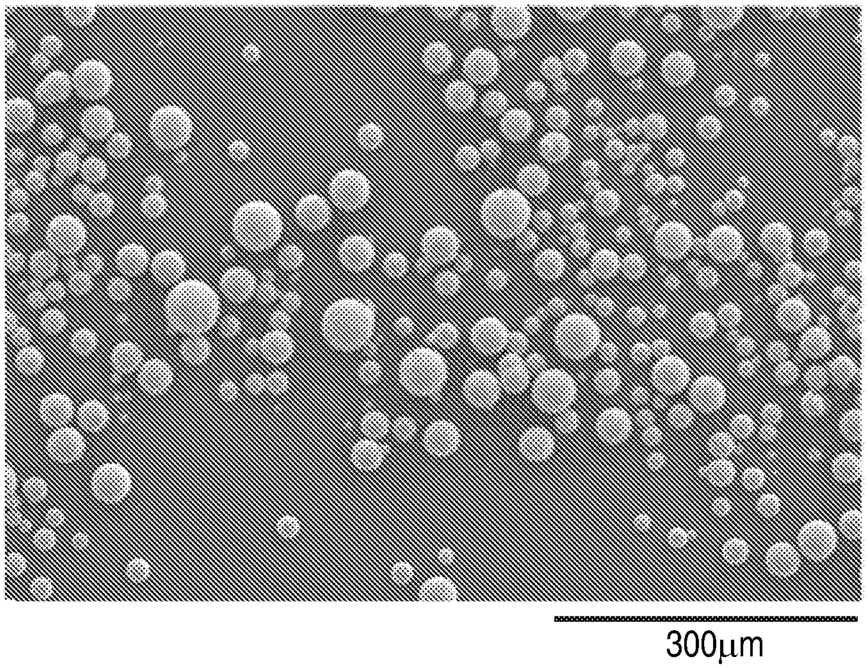
FIG. 10A is a scanning electron microscope (SEM) image of aluminum-coated hollow glass microspheres prepared in Preparative Example 1.
Figure 10B:
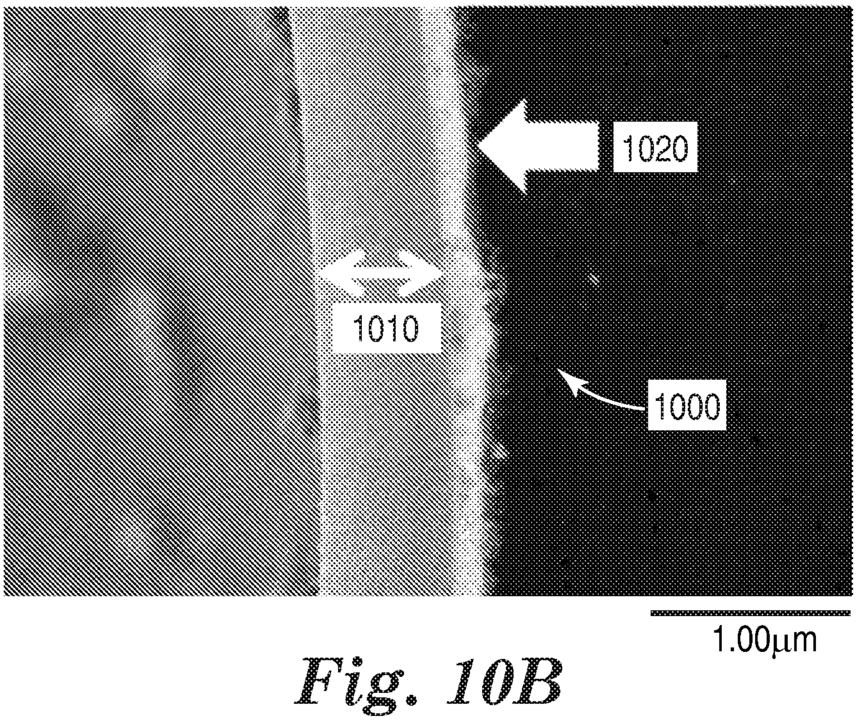
FIG. 10B is an SEM image of a cross-section of an aluminum-coated hollow glass microsphere prepared in Preparative Example 1.

Preparative Example 1: Aluminum was dc magnetron sputtered at 10 kW at an argon sputtering gas pressure of 10 millitorr onto 6000 g of S28HS glass bubbles. The thickness of the aluminum layer was 130-150 nm. FIG. 10A is a scanning electron microscopy (SEM) image of a plurality of aluminum coated S28HS glass bubbles (i.e., hollow glass microspheres). FIG. 10B is an SEM image of a cross-section of an aluminum coated S28HS glass bubble 1000, showing a wall 1010 of the microsphere and the aluminum coating 1020.

Preparative Example 2: The procedure was the same as in Preparative Example 1 except the duration of sputtering was continued until the thickness of aluminum on the glass bubbles reached to 250-300 nm.

Example 1: Preparation, Processing, and Measurement of a UV Curable 3D Printing Material with Aluminum-Coated Glass Bubbles Two batches, each consisting of 198.2 grams 3D printing resin, 1.4 grams OMNIRAD 819, 1 gram Cab-O-Sil TS720, and 30 grams aluminum-coated S28HS glass bubbles from Preparative Example 2 were mixed in a DAC 400 FVZ/VAC-P/LR Speedmixer (Hauschild GmbH, Hamm, Germany) for 2 minutes at 1400 rounds per minute at 400 millibar, and combined afterwards. These mixtures were filled into a D30II 3D printer (Rapid Shape GmbH, Heimsheim, Germany) directly after mixing and the print job was started.

Print job preparation was done with a Netfabb 2019 (Autodesk, San Rafael, CA) with the following parameters: energy dose: 950 millijoule per square decimeter; support width: 200 micrometers; Offset: 0 micrometers; shrinkage: 0.6 percent; Z-compensation: 0 micrometers; layer size: 50 micrometers; burn in factor: 500 percent.

3D printed parts were carefully removed from the platform after printing and transferred into a closable container containing isopropanol. This container was transferred into a Sonorex Super RK 1028 BH ultrasonic bath (Bandelin electronic GmbH, Berlin, Germany) filled with water and exposed to ultrasonication for 15 minutes. Afterwards, the parts were removed from the container and residual 3D printing material and isopropanol were removed using compressed air. This cleaning procedure was performed two times.

After cleaning each part, the parts were post cured in a RS Cure UV curing chamber (Rapid Shape GmbH, Heimsheim, Germany) using both wavelengths at maximum intensity under vacuum for 1200 seconds.

Figure 11A:
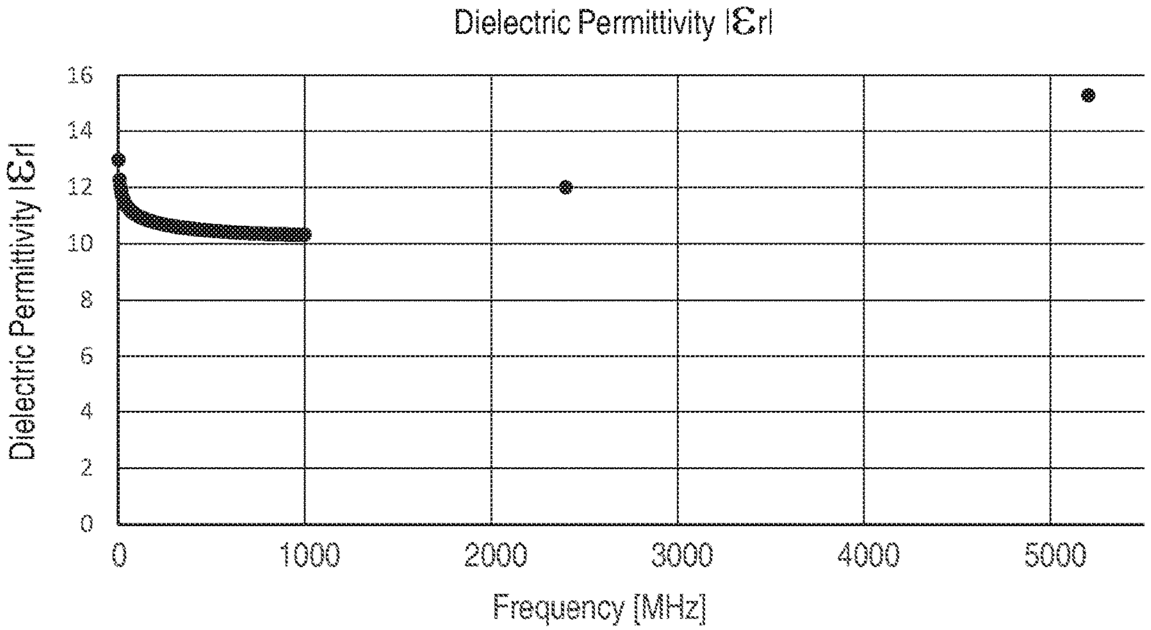
FIG. 11A is a graph of dielectric permittivity for an article according to Example 1.
Figure 11B:
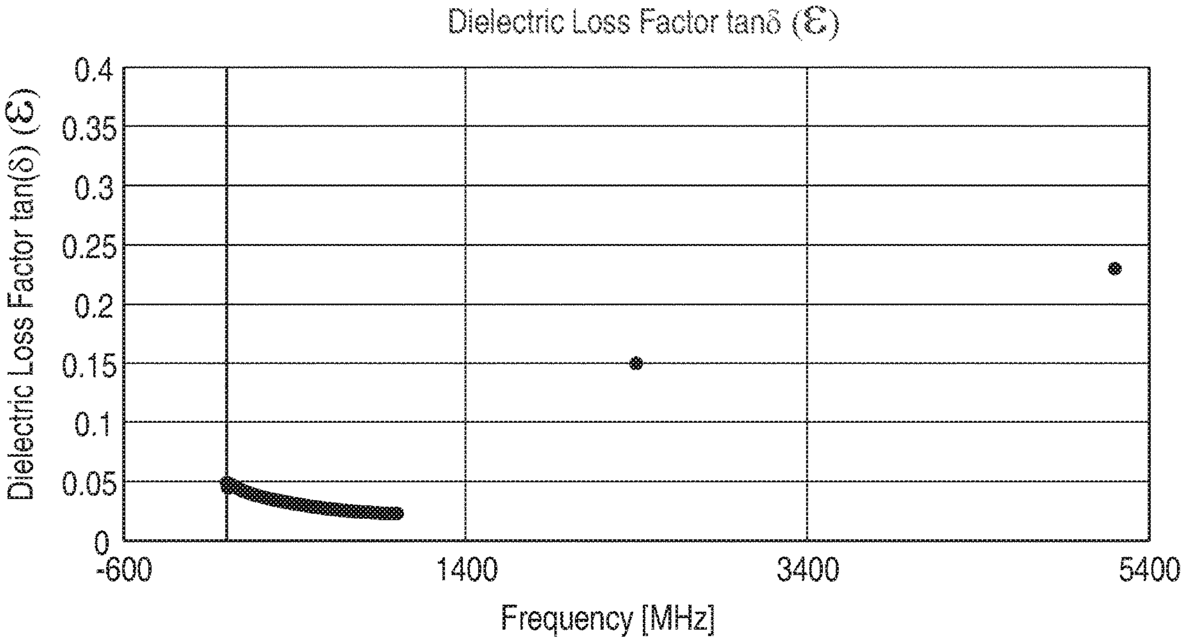
FIG. 11B is a graph of dielectric loss factor for an article according to Example 1.

Measurement of the dielectric properties was done according to the Dielectric Resonance (SPDR) Measurement Method at 2.4 gigahertz and 5.2 gigahertz. The results are shown in FIGS. 11A-B. In particular, FIG. 11A provides a graph of dielectric permittivity for the article and FIG. 11B provides a graph of dielectric loss factor for the article.

Example 2: Preparation Processing and Measurement of a 3D Printing Material with iM16K-MAS-1 Glass Bubbles Two batches, each consisting of 144.5 grams 3D printing resin, 0.9 grams OMNIRAD 819, 1.3 gram Cab-O-Sil TS720, and 55.3 grams iM16K-MAS-1 glass bubbles were mixed in a DAC 400 FVZ/VAC-P/LR Speedmixer (Hauschild GmbH, Hamm, Germany) for 2 minutes at 1400 rounds per minute at 400 millibar, and combined afterwards. These mixtures were filled into a D30II 3D printer (Rapid Shape GmbH, Heimsheim, Germany) directly after mixing and the print job was started.

Print job preparation was done with Netfabb 2019 (Autodesk, San Rafael, CA) with the following parameters: energy dose: 400 millijoules per square decimeter; support width: 200 micrometers; Offset: 0 micrometers; shrinkage: 0.6 percent; Z-compensation: 0 micrometers; layer size: 50 micrometers; burn in factor: 500 percent.

3D printed parts were carefully removed from the platform after printing and transferred into a closable container containing isopropanol. This container was transferred into a Sonorex Super RK 1028 BH ultrasonic bath (Bandelin electronic GmbH, Berlin, Germany) filled with water and exposed to ultrasonication for 15 minutes. Afterwards, the parts were removed from the container and residual 3D printing material and isopropanol were removed using compressed air. This cleaning procedure was done two times.

After cleaning each part, the parts were post cured in a RS Cure UV curing chamber (Rapid Shape GmbH, Heimsheim, Germany) using both wavelengths at maximum intensity under vacuum for 1200 seconds.

Measurement of the dielectric permittivity was done according to the Dielectric Resonance (SPDR) Measurement Method at 5.2 gigahertz. The measured dielectric permittivity was 2.18.

The complete disclosures of the patents, patent documents, and publications cited herein are incorporated by reference in their entirety as if each were individually incorporated. To the extent that there is any conflict or discrepancy between this specification as written and the disclosure in any document that is incorporated by reference herein, this specification as written will control. Various modifications and alterations to this disclosure will become apparent to those skilled in the art without departing from the scope and spirit of this disclosure. It should be understood that this disclosure is not intended to be unduly limited by the illustrative embodiments and examples set forth herein and that such examples and embodiments are presented by way of example only with the scope of the disclosure intended to be limited only by the claims set forth herein as follows.

What is claimed:

1. An actinic radiation curable precursor composition of a three-dimensional article, which comprises:

a) a resin comprising an actinic radiation curable component, wherein the resin has a viscosity no greater than 500 cP, when measured at 23°C;

b) a plurality of hollow glass microspheres having a density no greater than 2 g/mL and an average diameter no greater than 200 micrometers, wherein at least part of the surface of the hollow glass microspheres comprises a surface coating or modification; and c) a photoinitiator.

2. The composition of claim 1, wherein the unfilled resin has a viscosity no greater than 450 cP, no greater than 400 cP, no greater than 350 cP, no greater than 300 cP, no greater than 250 cP, no greater than 200 cP, no greater than 180 cP, no greater than 160 cP, no greater than 150 cP, no greater than 140 cP, no greater than 130 cP, no greater than 120 cP, no greater than 110 cP, or even no greater than 100 cP, when measured at 23 °C.

3. The composition of claim 1, wherein the resin has a density in a range from 0.7 to 1.4 g/mL, from 0.8 to 1.2 g/mL, from 0.8 to 1.1 g/mL, or even from 0.9 to 1.1 g/mL.

4. The composition of claim 1, wherein at least part of the surface of the hollow glass microspheres comprises a surface treatment selected from the group consisting of hydrophobic and hydrophilic surface functionalization.

5. The composition of claim 1, wherein at least part of the surface of the hollow glass microspheres comprises a surface functionalization selected from the group consisting of amino functionalization and (meth)acrylate functionalization.

6. The composition of claim 1, wherein at least part of the surface of the hollow glass microspheres comprises a surface coating.

7. The composition of claim 6, wherein the surface coating is a metal coating selected from the group consisting of aluminum, chromium, iron, titanium, silver, platinum, nickel, copper, zinc, tin, magnesium, cadmium, and any combinations or mixtures thereof.

8. The composition of claim 1, comprising:

a) from 40 to 95 vol. %, from 45 to 95 vol. %, from 45 to 90 vol. %, from 50 to 90 vol. %, from 60 to 90 vol. %, from 65 to 90 vol. %, from 65 to 85 vol. %, or even from 70 to 85 vol. %, of the resin comprising an actinic radiation curable component;

b) from 5 to 60 vol. %, from 5 to 55 vol. %, from 10 to 55 vol. %, from 10 to 50 vol. %, from 10 to 45 vol. %, from 10 to 40 vol. %, from 15 to 30 vol. %, from 15 to 35 vol. %, from 20 to 35 vol. %, or even from 25 to 35 vol. %, of the plurality of hollow glass microspheres; and c) from 0.05 to 5 vol. % of a photoinitiator.

9. The composition of claim 1, further comprising at least one of a rheology modifying agent or a dispersant.

10. The composition of claim 1, wherein the plurality of hollow glass microspheres is randomly distributed and embedded in the composition.

11. An article comprising a photo(co)polymerization reaction product of the composition of claim 1.

12. The article of claim 11, wherein the surface coating of the hollow glass microspheres is a metal coating and wherein the article alters a direction of electromagnetic waves directed at the article at a frequency of less than 1 GHz.

13. The article of claim 11, wherein the surface coating of the hollow glass microspheres is a metal coating and wherein the article has a relative permittivity ($e_r$) greater than 5, greater than 6, greater than 7, greater than 8, greater than 9, or even greater than 10, when measured at 2.4 GHz according to the Dielectric Resonance (SPDR) Measurement Method; or wherein the surface coating of the hollow glass microspheres is a metal coating and wherein the article has a relative permittivity ($e_r$) greater than 5, greater than 6, greater than 8, greater than 10, greater than 12, or even greater than 14, when measured at 5.2 GHz according to the Dielectric Resonance (SPDR) Measurement Method.

14. The article of claim 11, wherein the surface coating of the hollow glass microspheres is a metal coating and wherein the article has a dielectric loss tangent (tan delta) greater than 0.06, greater than 0.08, greater than 0.10, greater than 0.12, or even greater than 0.14, when measured at 2.4 GHz according to the Dielectric Resonance (SPDR) Measurement Method; or wherein the surface coating of the hollow glass microspheres is a metal coating and wherein the article has a dielectric loss tangent (tan delta) greater than 0.06, greater than 0.08, greater than 0.10, greater than 0.12, greater than 0.14, greater than 0.16, greater than 0.18, greater than 0.20, or even greater than 0.22, when measured at 5.2 GHz according to the Dielectric Resonance (SPDR) Measurement Method.

15. A method of manufacturing a three-dimensional article, the method comprising the steps of:

a) providing an actinic radiation curable precursor composition according to claim 1; and b) selectively exposing a portion of the actinic radiation curable precursor composition to a source of actinic radiation to at least partially cure the exposed portion of the actinic radiation curable precursor composition, thereby forming a cured layer, wherein steps a) and b) are repeated so as to form a three-dimensional article.

16. A three-dimensional article obtained according to the method of claim 5.

17. A method of interfering with electromagnetic radiation originating from an electromagnetic radiation producing device and received by an electronic device, wherein the method comprises the step of integrating an article according to claim 11 into the electronic device or placing an article according to claim 11 in the vicinity of the electronic device.

18. A method of interfering with electromagnetic radiation originating from an electromagnetic radiation producing device, wherein the method comprises the step of integrating an article according to claim 11 into the electronic device or placing an article according to claim 11 in the vicinity of the electromagnetic radiation producing device.

19. The method of claim 17, wherein the electronic device or the electromagnetic radiation producing device is selected from the group consisting of an antenna, an internet connected device, a smartphone, a tablet PC, a TV, a communication satellite, a wireless transmitter, a wireless router, a wireless amplifier, an autonomous driving assisting device, and any combinations thereof.

20. The method of claim 17, wherein the article modifies electromagnetic radiation originating from the electromagnetic radiation producing device at a frequency F1, wherein the frequency F1 is in a range from 300 MHz to 300 GHz, from 300 MHz to 3 GHz, from 3 GHz to 30 GHz, from 30 GHz to 300 GHz, from 1 to 10 GHz, from 1 to 8 GHz, from 1 to 6 GHz, or even from 2 to 6 GHz.

* * * * *